(12) United States Patent
Nishijima et al.

(10) Patent No.: US 8,953,358 B2
(45) Date of Patent: Feb. 10, 2015

(54) MEMORY DEVICE AND METHOD FOR DRIVING MEMORY DEVICE

(71) Applicant: Semiconductor Energy Laboratory Co., Ltd., Atsugi-shi, Kanagawa-ken (JP)

(72) Inventors: Tatsuji Nishijima, Kanagawa (JP); Hiroyuki Miyake, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 79 days.

(21) Appl. No.: 13/893,418

(22) Filed: May 14, 2013

(65) Prior Publication Data
US 2013/0308392 A1 Nov. 21, 2013

(30) Foreign Application Priority Data

May 18, 2012 (JP) ................................. 2012-114899

(51) Int. Cl.
*G11C 11/00* (2006.01)
*G11C 7/16* (2006.01)
*G11C 11/404* (2006.01)
(Continued)

(52) U.S. Cl.
CPC ................ *G11C 7/16* (2013.01); *G11C 11/404* (2013.01); *G11C 11/405* (2013.01); *G11C 11/565* (2013.01); *G11C 11/56* (2013.01); *G11C 27/005* (2013.01); *G11C 2211/5641* (2013.01);
(Continued)

(58) Field of Classification Search
CPC ........................................................ G11C 7/16

USPC .......... 365/189.02, 63, 129, 174, 189.07, 207
See application file for complete search history.

(56) References Cited

U.S. PATENT DOCUMENTS 5,528,032 A 6/1996 Uchiyama
6,127,702 A 10/2000 Yamazaki et al.
(Continued)

FOREIGN PATENT DOCUMENTS

JP 06-275697 A 9/1994
JP 2004-127481 A 4/2004

OTHER PUBLICATIONS

Takanori Matsuzaki et al.; "1 Mb Non-Volatile Random Access Memory Using Oxide Semiconductor"; IMW 2011 (3rd IEEE International Memory Workshop); May 22, 2011; pp. 185-188.
(Continued)

*Primary Examiner* — Fernando Hidalgo
(74) *Attorney, Agent, or Firm* — Fish & Richardson P.C.

(57) ABSTRACT

A memory device in which one memory cell can operate in both a single-level cell mode and a multi-level cell mode includes a signal transmission path for a multi-level cell mode in which a multi-bit digital signal representing any of three or more states input to the memory circuit is converted by a D/A converter and stored in the memory cell and the stored data is read by converting a signal output from the memory cell into a multi-bit digital signal with an A/D converter and the multi-bit digital signal is output from the memory circuit, and a signal transmission path for a single-level cell mode in which a single-bit digital signal representing any of two states input to the memory circuit is directly stored in the memory cell and the signal stored in the memory cell is directly output from the memory cell.

20 Claims, 10 Drawing Sheets

(51) Int. Cl.
  *G11C 11/405* (2006.01)
  *G11C 11/56* (2006.01)
  *G11C 27/00* (2006.01)
  *H01L 27/06* (2006.01)
  *H01L 27/108* (2006.01)
  *H01L 27/115* (2006.01)

(52) U.S. Cl.
  CPC ........... *H01L27/0688* (2013.01); *H01L 27/108* (2013.01); *H01L 27/1156* (2013.01)
  USPC ........ 365/129; 365/189.02; 365/63; 365/174; 365/189.07; 365/207

(56) References Cited

U.S. PATENT DOCUMENTS

| | | |
|---|---|---|
| 6,947,322 B2 | 9/2005 | Anzai et al. |
| 7,636,078 B2 | 12/2009 | Yamazaki et al. |
| 7,674,650 B2 | 3/2010 | Akimoto et al. |
| 8,059,109 B2 | 11/2011 | Yamazaki et al. |
| 8,811,108 B2 * | 8/2014 | Vilela et al. ............... 365/230.06 |
| 2006/0262066 A1 | 11/2006 | Yamazaki et al. |
| 2008/0084403 A1 | 4/2008 | Kimura et al. |
| 2010/0148171 A1 | 6/2010 | Hayashi et al. |

OTHER PUBLICATIONS

Tomoyuki Ishii et al.; "A Poly-Silicon TFT With a Sub-5-nm Thick Channel for Low-Power Gain Cell Memory in Mobile Applications"; IEEE Transactions on Electron Devices; Nov. 1, 2004; pp. 1805-1810; vol. 51, No. 11.

Wonchan Kim et al.; "An Experimental High-Density DRAM Cell with a Built-in Gain Stage"; IEEE Journal of Solid-State Circuits; Aug. 1, 1994; pp. 978-981; vol. 29, No. 8.

Shoji Shukuri et al.; "A Complementary Gain Cell Technology for Sub-1V Supply DRAMs"; IEDM 92: Technical Digest of International Electron Devices Meeting; Dec. 13, 1992; pp. 1006-1008.

Shoji Shukuri et al.; "A Semi-Static Complementary Gain Cell Technology for Sub-1 V Supply DRAM's"; IEEE Transactions on Electron Devices; Jun. 1, 1994; vol. 41, No. 6, pp. 926-931.

* cited by examiner

MEMORY DEVICE AND METHOD FOR DRIVING MEMORY DEVICE

BACKGROUND OF THE INVENTION

1. Field of the Invention

The present invention relates to an object or product (including a machine, and a manufacture) and a method or process (including a simple method and a production method). In particular, one embodiment of the present invention relates to a semiconductor device, a display device, a light-emitting device, a power storage device, a driving method thereof, or a manufacturing method thereof. In particular, one embodiment of the present invention relates to a memory device and a method for driving the memory device.

2. Description of the Related Art

Memory devices can be classified into single-level cell (SLC) memory devices in which a 1-bit (single-bit, 2-state) signal is stored in one memory cell using a digital signal "0" or "1" and multi-level cell (MLC) memory devices in which multi-bit (3-or-more-state) signal is stored in one memory cell using a digital signal "0" or "1".

The single-level cell and the multi-level cell each have their own advantages. For example, the single-level cell has advantages such as high signal reliability (i.e., extremely low probability of a difference between a write signal and a read signal) and high access speed, while the multi-level cell has an advantage of storing a larger amount of data in one memory cell.

In view of the above, a memory device which can function as a single-level cell memory device and/or a multi-level cell memory device depending on use is desired. As an example of such a memory device, there is a memory device having a structure disclosed in Patent Document 1 in which a single-level cell region (also referred to as a region including a plurality of single-level memory cells) and a multi-level cell region (also referred to as a region including a plurality of multi-level memory cells) are separately provided. However, in order that a memory device having a small number of memory cells can function as both a single-level cell memory device and a multi-level cell memory device, it is preferable that each memory cell can function as both a single-level cell and a multi-level cell.

REFERENCE

Patent Document

[Patent Document 1] Japanese Published Patent Application No. 2004-127481

SUMMARY OF THE INVENTION

In consideration of the above technical background, an object of one embodiment of the present invention is to provide a memory device in which one memory cell can operate in both a single-level cell mode and a multi-level cell mode.

Memory devices are desired to perform the above-described function, while they are also desired to achieve low power consumption and high-speed driving.

Accordingly, an object of one embodiment of the present invention is to provide a method for driving the above-described memory device with little power.

Furthermore, an object of one embodiment of the present invention is to provide a method for driving the above-described memory device at high speed.

It is an object of the present invention to achieve at least one of the above-mentioned objects.

Note that the description of these objects does not disturb the existence of other objects. Note that there is no need to achieve all of these objects with one embodiment of the present invention. Other objects will be apparent from and can be derived from the description of the specification, the drawings, the claims, and the like.

In one embodiment of the present invention, a memory circuit including a memory cell has a structure in which a signal transmission path in the memory circuit can be switched in accordance with the operating mode of the memory cell (the multi-level cell mode or the single-level cell mode) in writing a signal (data) to the memory cell or reading the signal (data) written to the memory cell.

Specifically, in the case of using the memory cell included in the memory circuit as a multi-level cell, a multi-bit digital signal representing any of three or more states (hereinafter referred to as a multi-bit digital signal) input to the memory circuit is converted into an analog signal by a digital/analog converter (hereinafter referred to as a D/A converter) and the analog signal is stored in the memory cell in the memory circuit. In the case of reading the data represented by the analog signal (multi-bit data) from the memory cell, the signal that is based on the stored signal and is output from the memory cell is converted into a multi-bit digital signal by an analog/digital converter (hereinafter referred to as an A/D converter) and the multi-bit digital signal is output from the memory circuit. In order to conduct this operation, a signal transmission path in which the D/A converter and the A/D converter are provided is used in the memory circuit.

In contrast, in the case of using the memory cell included in the memory circuit as a single-level cell, a single-bit digital signal representing any of two states (hereinafter referred to as a single-bit digital signal) input to the memory circuit is directly stored in the memory cell. In the case of reading the data represented by the signal stored in the memory cell (single-bit data), the signal that is based on the stored signal and is output from the memory cell is directly output from the memory cell. In order to conduct this operation, a signal transmission path in which a D/A converter and an A/D converter are not provided is used in the memory circuit.

With the above-described structure of the memory device, one memory cell can operate in both a single-level cell mode and a multi-level cell mode.

In the case of using the memory cell as a single-level cell, since the signal transmission path in which the D/A converter and the A/D converter do not lie is selected in the memory circuit, power supply to the D/A converter and the A/D converter can be stopped. Accordingly, power consumption of the memory circuit can be reduced.

In the case where the signal is transmitted through the D/A converter and the A/D converter, loss (e.g., time loss for the signal transmission) arises at the D/A converter and the A/D converter. By switching the signal transmission path between the single-level cell mode and the multi-level cell mode in the above-described manner, such a loss does not arise; accordingly, the memory device can be driven at high speed in the case of the single-level cell mode.

That is, one embodiment of the present invention is a memory device which includes: a plurality of memory circuits arranged in a matrix; a control circuit which selects whether a memory cell in each of the memory circuits is used as a single-level cell or a multi-level cell; an input-output portion which outputs signals that are based on the selection by the control circuit to the plurality of memory circuits and to which signals from the plurality of memory circuits are input; a selection circuit which determines a signal transmission path in the memory circuits based on the selection by the control circuit; an input signal line which transmits signal output from the input-output portion to the memory circuits; an output signal line which transmits signal output from the memory circuits to the input-output portion; and a selection signal line which transmits signal output from the selection circuit to the memory circuits. The memory circuits each includes: the memory cell which stores an input signal and outputs a first signal that is based on the stored signal; a first input path which transmits a signal input from the input signal line to the memory cell through a first switching element and a D/A converter; a second input path which transmits a signal input from the input signal line to the memory cell through a second switching element; a first output path which transmits the first signal output from the memory cell to the output signal line through an A/D converter and a third switching element; and a second output path which transmits the first signal output from the memory cell to the output signal line through a fourth switching element.

With the above-described structure of the memory device, one memory cell can operate in both a single-level cell mode and a multi-level cell mode.

In the above-described structure of the memory device, the memory cell has properties of storing a written signal even when power is not supplied to the memory cell, and thus the memory cell can store the signal even after the power supply to the memory device is stopped. Accordingly, by stopping power supply (this operation is also referred to as power gating) to the memory device when the operation of the memory device is unnecessary, power consumption of the memory device can be reduced.

In the above-described structure of the memory device, the memory cell includes a signal supply portion which outputs a signal used for generating the first signal and an output function portion which outputs the first signal that is based on the stored signal. The voltage of a signal supplied from the signal supply portion in the case where a signal is input to the storage function portion through the second input path may be lower than the voltage of a signal supplied from the signal supply portion in the case where a signal is input to the storage function portion through the first input path. In this way, power consumption of the memory device can be reduced.

Note that the storage function portion includes a capacitor, a second transistor, and a first transistor using an oxide semiconductor material in its active layer. The output function portion includes the second transistor and the signal supply portion. One of a source and a drain of the first transistor is electrically connected to the first input path and the second input path, and the other of the source and the drain of the first transistor is electrically connected to a gate of the second transistor and the capacitor. A signal input from the first input path is stored in a node which is electrically connected to the other of the source and the drain of the first transistor, the gate of the second transistor, and the capacitor. One of a source and a drain of the second transistor is electrically connected to the signal supply portion. The first signal that is based on the signal stored in the node is output from the other of the source and the drain of the second transistor. With this structure, the memory cell can store the signal for a long period even after power supply is stopped; accordingly, power consumption of the memory device can be effectively reduced.

Another embodiment of the present invention is a method for driving the memory device having the above-described structure. In the case of writing a signal representing single-bit data to the memory cell and reading the signal representing single-bit data from the memory cell, the first switching element and the third switching element are set in a non-conducting state and the second switching element and the fourth switching element are set in a conducting state to transmit and write a signal input from the input signal line to the memory circuit through the first input path to the memory cell and to transmit and read a signal output from the memory cell through the first output path to the output signal line. In the case of writing a signal representing multi-bit data to the memory cell and reading the signal representing multi-bit data from the memory cell, the second switching element and the fourth switching element are set in a non-conducting state and the first switching element and the third switching element are set in a conducting state to transmit and write a signal input from the input signal line to the memory circuit through the second input path to the memory cell and to transmit and read a signal output from the memory cell through the second output path to the output signal line.

By employing the above-described driving method, one memory cell can operate in both a single-level cell mode and a multi-level cell mode.

Further, another embodiment of the present invention is a method for driving a memory device, in which in the memory circuit having the above-described structure, the voltage of a signal supplied from the signal supply portion in the case where a signal is input to the storage function portion through the second input path is lower than the voltage of a signal supplied from the signal supply portion in the case where a signal is input to the storage function portion through the first input path.

With this driving method, power consumption of the memory device can be reduced.

In the above-described method for driving the memory device, in the case of storing both single-bit data written to the memory cell and newly-written multi-bit data in one memory cell, a multi-bit digital signal which consists of a most significant bit in which the single-bit data read from the memory cell is set, a second bit in which 0 is set, and bits lower than the second bit in which the newly-written multi-bit data is set is written to the memory cell; in the case of reading the multi-bit data from the memory cell, the multi-bit data is read through the first output path; and in the case of reading the single-bit data from the memory cell, the single-bit data is read through the second output path. In this manner, single-bit data and multi-bit data can be stored in one memory cell at the same time, and the single-bit data and the multi-bit data can be selectively read.

With the structure described in this specification and the like that can switch the signal transmission path in such a manner that a signal transmission path in which a D/A converter and an A/D converter lie is selected in the case of using a memory cell as a multi-level cell and a signal transmission path in which the D/A converter and the A/D converter do not lie is selected in the case of using the memory cell as a single-level cell, one memory cell can operate in both a single-level cell mode and a multi-level cell mode.

In the above-described structure, in the case of using the memory cell as a single-level cell, the signal does not need to pass through the D/A converter and the A/D converter; accordingly, lower power consumption and higher-speed operation of the memory circuit can be achieved.

DETAILED DESCRIPTION OF THE INVENTION

Figure 1A:
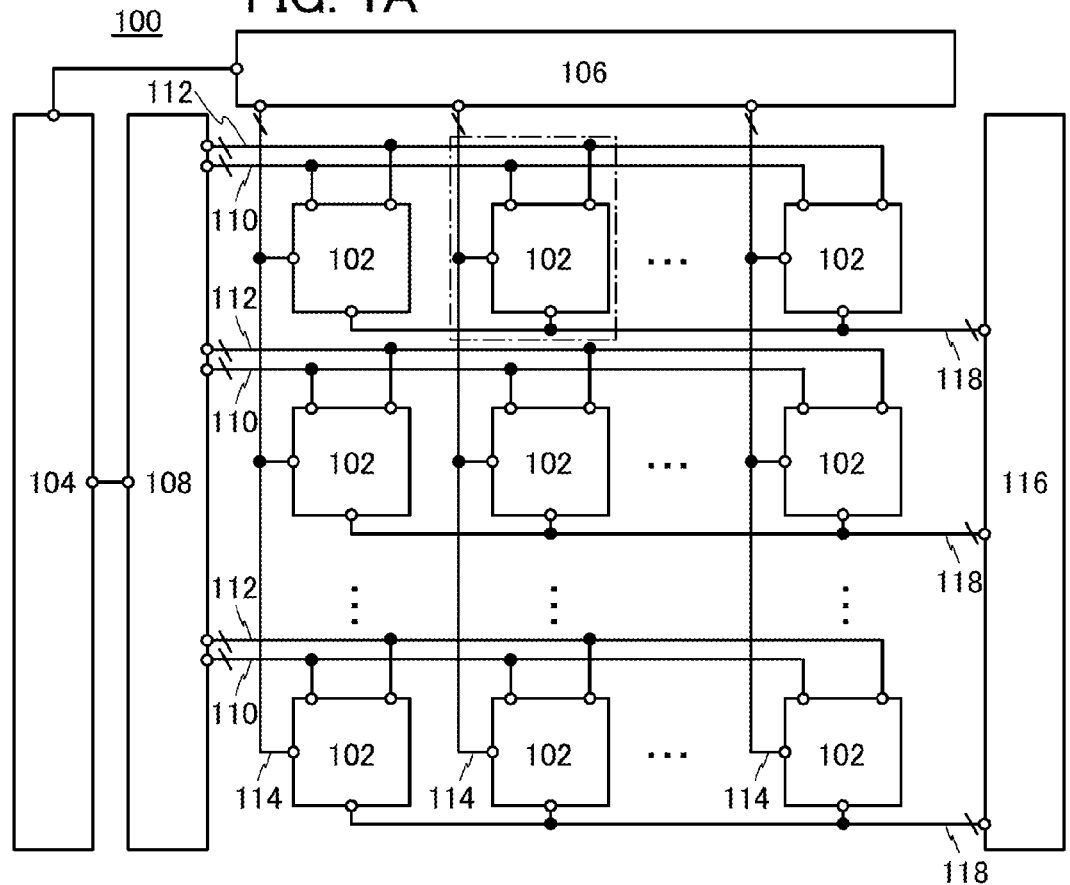
FIG. 1A illustrates a circuit configuration of a memory device and FIG. 1B illustrates a circuit configuration of a memory circuit.

Embodiments of the invention disclosed in this specification will be described below with reference to the accompanying drawings. Note that the present invention is not limited to the following description and it will be readily appreciated by those skilled in the art that modes and details can be modified in various ways without departing from the spirit and the scope of the present invention. Therefore, the invention should not be construed as being limited to the description in the following embodiments.

Note that in the following embodiments, the same portions or portions having similar functions are denoted by the same reference numerals in different drawings, and explanation thereof will not be repeated.

In drawings and the like, actual position, size, range, and the like of components are not shown in some cases for easy understanding. Therefore, the position, size, range, and the like of the invention disclosed herein are not necessarily limited to those disclosed in the drawings and the like.

Note that a node in this specification and the like refers to an element (e.g., a wiring) which enables electrical connection between elements included in a circuit. Therefore, a "node to which A is connected" is a wiring which is electrically connected to A and can be regarded as having the same potential as A. Even when one or more elements which enable electrical connection (e.g., switches, transistors, capacitors, inductors, resistors, or diodes) are inserted in a portion of the wiring, the wiring can be regarded as the "node to which A is connected" as long as it has the same potential as A.

Embodiment 1

In this embodiment, a configuration of a memory device is described with reference to FIGS. 1A and 1B and FIGS. 3A and 3B. Further, an example of a method for driving the memory device is described with reference to FIGS. 4A and 4B and FIGS. 5A and 5B.

⟨Structure Example of Memory Device⟩

Figure 1B:
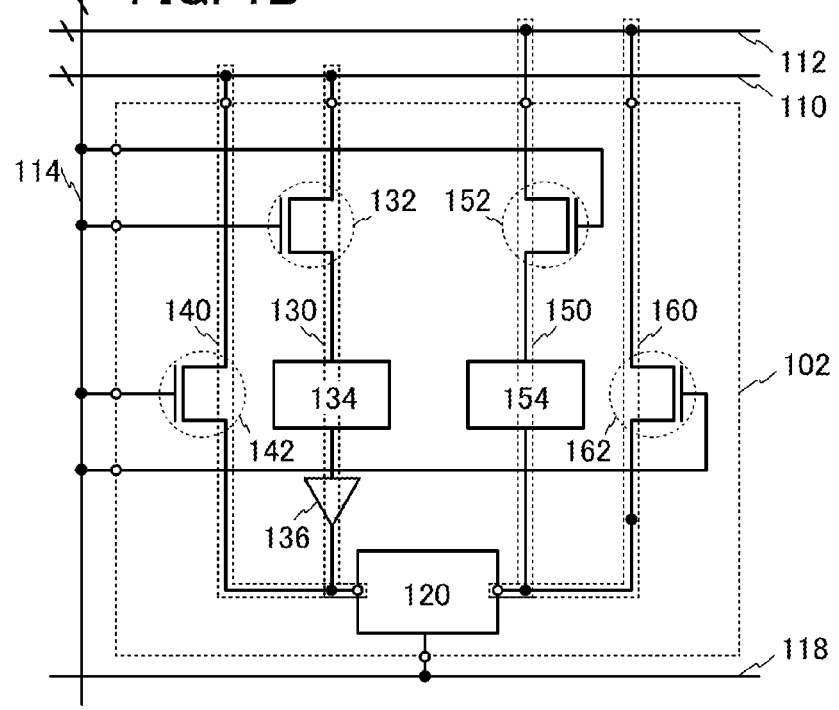

FIGS. 1A and 1B illustrate a configuration example of a memory device having effects that are described in this specification and the like. FIG. 1A is a block circuit diagram illustrating a configuration concept of the memory device, and FIG. 1B is a circuit diagram illustrating an example of a circuit configuration of a region surrounded by a dashed-dotted line in FIG. 1A (the region can also be expressed as one of a plurality of memory circuits arranged in a matrix in the memory device).

As illustrated in FIG. 1A, the memory device 100 includes a plurality of memory circuits 102 arranged in a matrix, a control circuit 104 which selects whether the memory circuits 102 are used as single-level cells or multi-level cells, an input-output portion 108 which is connected to the control circuit 104 and the memory circuits 102 and outputs signals that are based on the selection by the control circuit 104 to the memory circuits 102 and to which signals from the memory circuits 102 are input, a selection circuit 106 which is connected to the control circuit 104 and the memory circuits 102 and determines a signal transmission path in the memory circuits 102 based on the selection by the control circuit 104, input signal lines 110 which transmit signals that are output from the input-output portion 108 to the memory circuits 102, output signal lines 112 which transmit signals that are output from the memory circuits 102 to the input-output portion 108, and selection signal lines 114 which transmit signals that are output from the selection circuit 106 to the memory circuits 102.

As illustrated in FIG. 1B, each of the memory circuits 102 includes a memory cell 120 which stores an input signal and outputs a first signal that is based on the stored signal, a first input path 130 which transmits a signal input from the input signal line 110 to the memory cell 120 through a first switching element 132 and a D/A converter 134, a second input path 140 which transmits a signal input from the input signal line 110 to the memory cell 120 through a second switching element 142, a first output path 150 which transmits the first signal output from the memory cell 120 to the output signal line 112 through an A/D converter 154 and a third switching element 152, and a second output path 160 which transmits the first signal output from the memory cell 120 to the output signal line 112 through a fourth switching element 162.

Note that in order to delay the output from the D/A converter 134 in the first input path 130, a buffer 136 may be provided between the D/A converter 134 and the memory cell 120 as illustrated in FIG. 1B. Practitioners can appropriately choose whether to provide the buffer 136.

Further, a signal for controlling the operation state of the memory cell 120 is input to the memory cell 120 from a driver circuit 116 through a word line 118.

A structural feature of the memory device described in this specification and the like is that the memory cell 120 in the memory circuit 102 is connected to two paths, which are a path (1) through which multi-bit data is written to and read from the memory cell 120 through the D/A converter 134 and the A/D converter 154 and a path (2) through which single-bit data is directly written to and read from the memory cell 120 without passing through the D/A converter 134 and the A/D converter 154. With this structure, in the case where the memory device 100 is required to have a large capacity, the path (1) is selected in the memory circuit 102 to use the memory cell 120 as a multi-level cell, and if need arises, the path in the memory circuit 102 can be switched to the path (2) to use the memory circuit 102 as a single-level cell.

In the case of using the memory cell 120 as a single-level cell, as described above, a signal is transmitted through the path in which the D/A converter 134 and the A/D converter 154 do not lie. In this case, loss that results from signal processing in the converters (e.g., time loss) is not caused; accordingly, the memory device 100 can be driven at high speed.

Further in the case of using the memory cell 120 as a single-level cell, power supply to the D/A converter 134 and the A/D converter 154 can be stopped, which leads to a reduction in the power consumption of the memory device 100.

Figure 2:
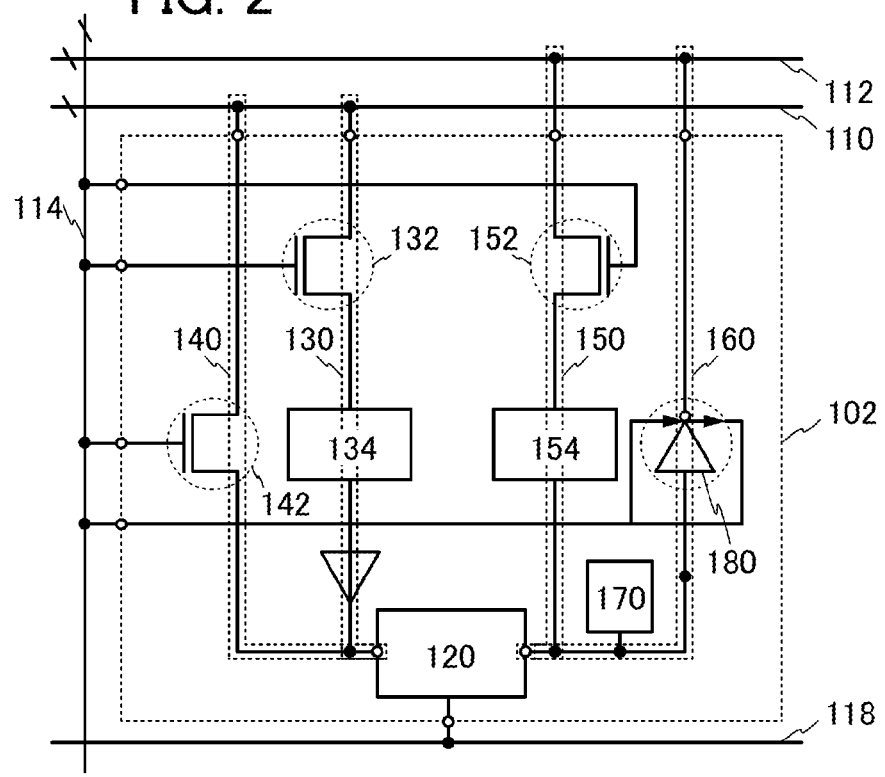
FIG. 2 illustrates a circuit configuration of a memory circuit.

In FIG. 1B, transistors are illustrated as the switching elements lying in the input path and the output path; however, the switching elements may be any of the other various elements as long as they are elements whose on/off state can be controlled. For example, analog switches can be used as the switching elements. Furthermore, in order to delay the signal that is output from the memory cell 120 through the second output path 160, the fourth switching element 162 may be replaced with a clocked inverter 180 as illustrated in FIG. 2. Alternatively, in order to add a delay function, an inverter may be connected to the transistor.

Any of known techniques can be used in the memory cell 120 as long as the memory cell 120 includes "a portion having a function of storing an input signal (hereinafter also referred to as a storage function portion)" and "a portion having a function of outputting the first signal that is based on the stored signal (hereinafter also referred to as an output function portion. The case of outputting the stored signal as the first signal is included)."

If the output function portion has a structure (e.g., source follower) of keep outputting a constant signal (a signal with a constant voltage) that is based on the stored signal, the circuit configuration illustrated in FIG. 2 is acceptable. However, in the case of directly outputting the stored signal as the first signal, the output signal is small and the voltage of the output signal may vary over time. Accordingly, it is preferable to employ a structure in which an amplifier circuit such as a sense amplifier is appropriately provided in the output path, as necessary.

As illustrated in FIG. 2, a constant current source 170 may be provided in the output path as necessary. Note that the constant current source may be used as a precharge circuit (e.g., the constant current source is used as a constant current source in the case of a multi-level cell mode and as a precharge circuit in the case of a single-level cell mode).

It is preferable that the storage function portion have nonvolatile properties that enable a signal to be stored in the memory cell even when power is not supplied to the memory cell. As examples of a specific structure of the storage function portion, a magnetic tunnel junction (MTJ) element used in a magnetoresistive random access memory (MRAM), a transistor having a floating gate used in a flash memory, a transistor including a colossal magneto-resistive (CMR) film used in a ferroelectric random access memory (FeRAM), and the like can be given.

The above-described elements can not only store input data but also output the stored signal that is based on the first signal and thus can each be considered as both a "storage function portion" and an "output function portion."

With a structure that uses a transistor including an oxide semiconductor material in its semiconductor layer (at least in a region where a channel is formed) as a component of the memory cell, the memory cell can have nonvolatile properties. Note that in the description below, the transistor including an oxide semiconductor material in its semiconductor layer is also referred to as an OS transistor.

Figure 3A:
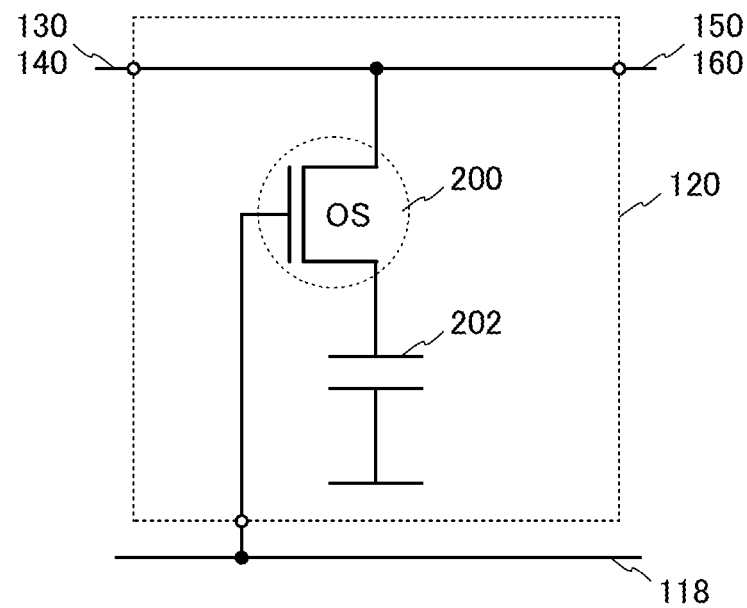
FIGS. 3A and 3B each illustrate a circuit configuration of a memory cell.
Figure 3B:
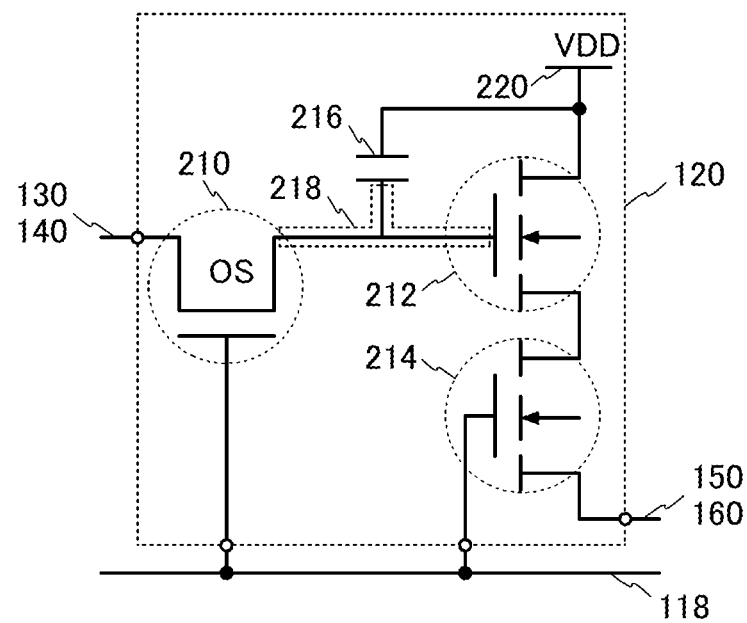
Figure 4A:
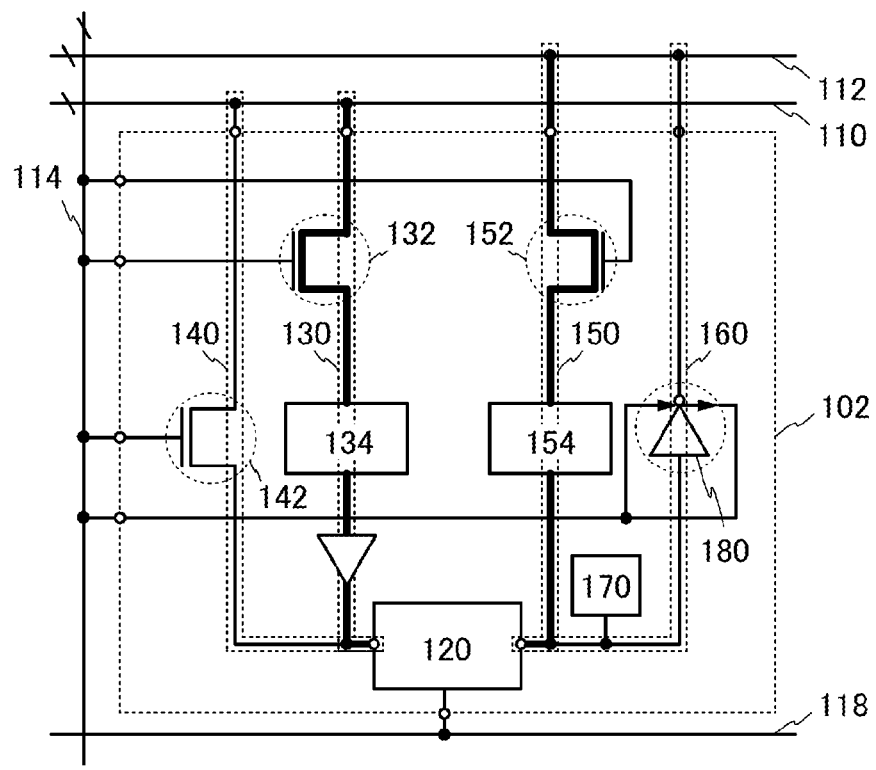
FIGS. 4A and 4B each illustrate an operation state of a memory circuit.
Figure 4B:
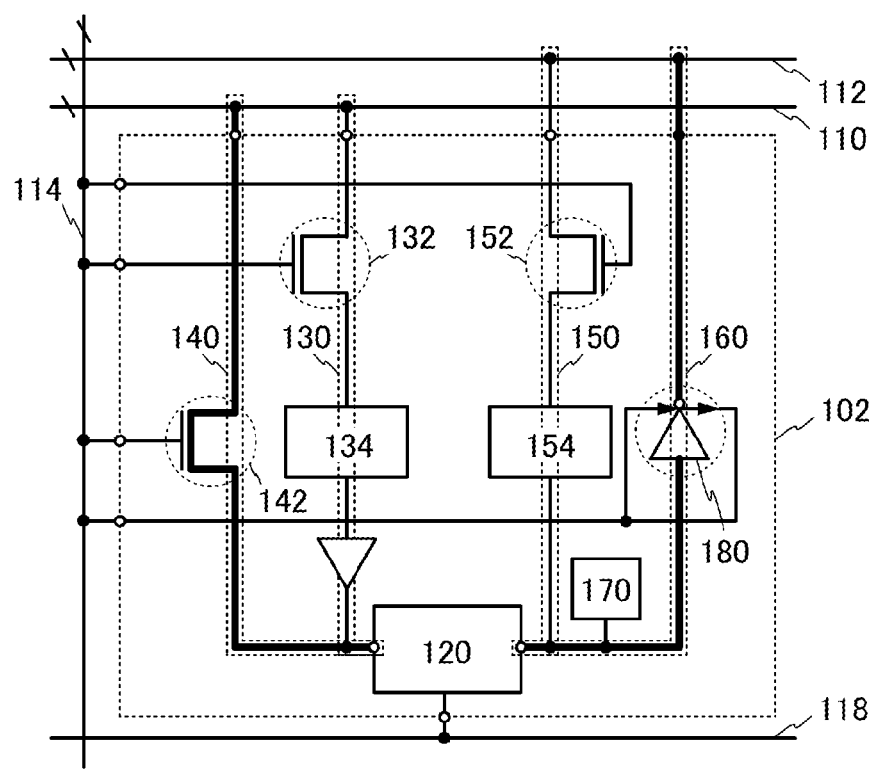

As examples of a configuration of the memory cell having nonvolatile properties by using an OS transistor as a component, the configurations illustrated in FIGS. 3A and 3B can be given.

In FIG. 3A, a transistor 200 is connected to a capacitor 202 in series. An OS transistor is used as the transistor 200 although the structure itself is a structure generally used in a DRAM and the like. Note that since the first input path 130 and the second input path 140 are both connected to the memory cell 120 as the signal input paths, the signal input path is denoted by both reference numerals in the drawings. Similarly, the signal output path is denoted by both 150 and 160 in the drawings.

The semiconductor layer including an oxide semiconductor material included in the transistor 200 has an energy gap of 3.0 eV (electron volts) or more, which is significantly larger than the band gap of silicon (1.1 eV).

The off-resistance of the transistor (resistance between a source and a drain when the transistor is in an off state) is inversely proportional to the concentration of carriers thermally excited in the semiconductor layer where a channel is formed. Since the band gap of silicon is 1.1 eV even in a state where there is no carrier caused by a donor or an acceptor (i.e., even in the case of an intrinsic semiconductor), the concentration of thermally excited carriers at room temperature (300 K) is approximately $1 \times 10^{11}$ cm$^{-3}$.

In contrast, in the case of a semiconductor whose band gap is, for example, 3.2 eV (an oxide semiconductor is assumed here), the concentration of thermally excited carriers is approximately $1 \times 10^{-7}$ cm$^{-3}$. When the electron mobility is the same, the resistivity is inversely proportional to the carrier concentration, and thus the resistivity of the semiconductor having a band gap of 3.2 eV is higher by 18 orders of magnitude than that of silicon.

Such an OS transistor in which an oxide semiconductor material having a wide band gap is used for the semiconductor layer can achieve an extremely low off-state current.

Accordingly, in the case where the transistor connected to the capacitor as illustrated in FIG. 3A (such a transistor can also be referred to as a transistor which controls input/output of a signal to/from the capacitor) is an OS transistor, the signal supplied to the capacitor 202 can be stored for a long time when the OS transistor is turned off in response to the signal from the word line 118 and power is not supplied to the memory cell. The OS transistor can be formed using the same apparatus and method as those of a thin film transistor using silicon or the like; therefore, there is an advantage that it can reduce the load of new capital investment or the load of a study of the manufacturing method. Note that in the case where the signal read from the memory cell is small, a sense amplifier may be provided in the output path as necessary. Alternatively, a constant current source may be provided in the output path.

If the off-state current of the transistor 200 which controls input/output of a signal to/from the capacitor is low, an element other than the OS transistor (e.g., an MTJ element) may be used as the transistor 200.

The configuration of FIG. 3A not only stores input data but also outputs the stored signal as the first signal, and thus can be considered as both a "storage function portion" and an "output function portion."

In the case of the memory cell having the structure of directly outputting the stored signal as the first signal, the output signal from the memory cell is small in some cases. In such a case, it is difficult to use the memory cell as a multi-level cell. In consideration of this, the "storage function portion" and the "output function portion" that outputs the first signal that is based on the signal stored in the storage function portion may be separately prepared; an example of this configuration is illustrated in FIG. 3B.

The memory cell 120 in FIG. 3B includes a first transistor 210, a second transistor 212, a third transistor 214, and a capacitor 216. One of a source and a drain of the first transistor 210 is electrically connected to the input path, and the other of the source and the drain of the first transistor 210 is electrically connected to a gate of the second transistor 212 and the capacitor 216. Note that in FIG. 3B, the signal input path and the signal output path are each denoted by two reference numerals as in FIG. 3A.

When the first transistor 210 is an OS transistor and is in an off state, the signal input from the input path is stored in a node 218 which is connected to the first transistor 210, the second transistor 212, and the capacitor 216.

Thus, with the use of the first transistor 210, the second transistor 212, and the capacitor 216, the storage function of the memory cell 120 can be attained. Thus, the first transistor 210, the second transistor 212, and the capacitor 216 can be expressed as a "storage function portion."

One of a source and a drain of the second transistor 212 is connected to a signal supply portion 220 (also referred to as VDD in the drawing). The first signal that is based on the signal stored in the node 218 is output to one of a source and a drain of the third transistor 214 from the other of the source and the drain of the second transistor 212. By turning on the third transistor 214, the first signal is output to the output signal line.

In this manner, with the use of the second transistor 212, the third transistor 214, and the signal supply portion 220, the output function of the memory cell 120 can be attained. Thus, the second transistor 212, the third transistor 214, and the signal supply portion 220 can be expressed as an "output function portion."

Materials for active layers in the second transistor 212 and the third transistor 214 are not particularly limited and known various materials can be used as such materials. For example, in terms of high-speed driving of the memory device 100, a material with high mobility such as single crystal silicon is preferable.

Figure 10A:
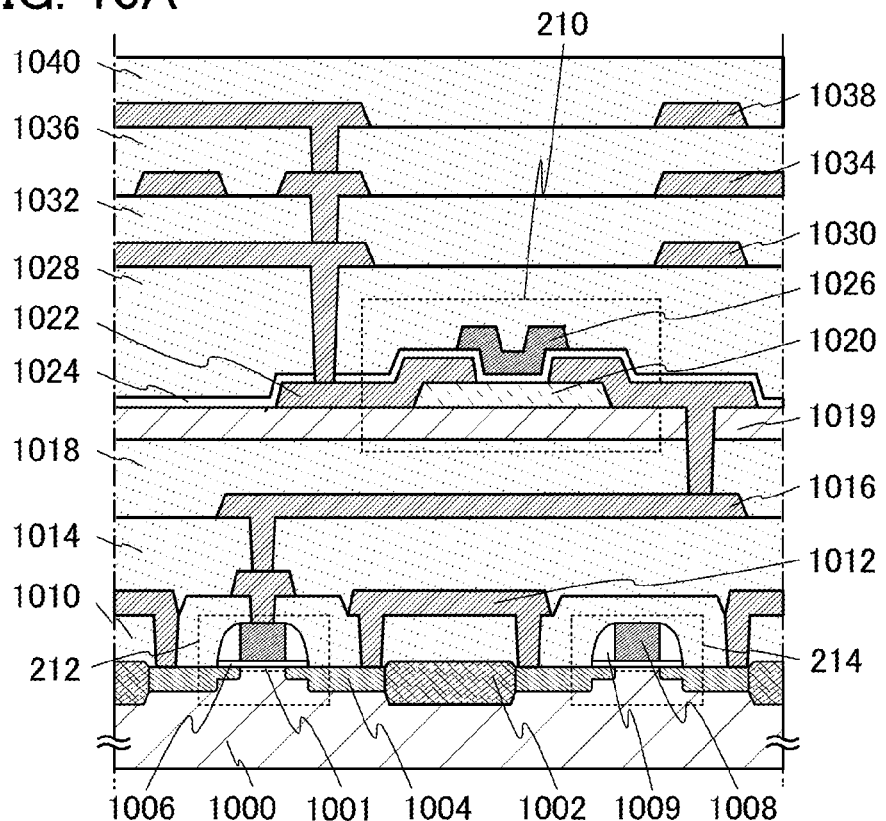
FIGS. 10A to 10C illustrate a structure of a memory cell.

An example of a cross-sectional view in the case of using an OS transistor as the first transistor 210 and using single crystal silicon in the active layers of the second transistor 212 and the third transistor 214 is illustrated in FIG. 10A.

FIG. 10A illustrates an example of a cross-sectional view of part of the memory cell 120, in which the second transistor 212 and the third transistor 214 which include single crystal silicon in the active layers are provided over a single crystal silicon substrate 1000 and the first transistor 210 including an oxide semiconductor material in the active layer is provided over the second transistor 212 and the third transistor 214.

The second transistor 212 and the third transistor 214 each include low-resistance regions 1004 provided in the single crystal silicon substrate 1000 and functioning as a source and a drain, a channel formation region 1001 located in the single crystal silicon substrate 1000 and between the low-resistance regions 1004, a gate insulating film 1006 over the channel formation region 1001, and a gate electrode 1008 provided over the channel formation region 1001 with the gate insulating film 1006 interposed therebetween.

The second transistor 212 and the third transistor 214 are separated by a separation layer 1002 that is provided in the single crystal silicon substrate 1000. A conductive film 1012 that is provided over an interlayer film 1010 that covers the second transistor 212 and the third transistor 214 electrically connects the low-resistance region 1004 of the second transistor 212 to the low-resistance region 1004 of the third transistor 214. Further, the gate electrode 1008 is provided with a sidewall insulating film 1009 that covers a side surface of the gate electrode 1008.

Materials and formation methods for the separation layer 1002, the low-resistance regions 1004, the gate insulating film 1006, the gate electrode 1008, the sidewall insulating film 1009, the interlayer film 1010, and the conductive film 1012 are not particularly limited, and known techniques can be used.

The first transistor 210 includes an oxide semiconductor film 1020 provided over an insulating film 1019, a conductive film 1022 electrically connected to the oxide semiconductor film 1020 and serving as the source and the drain of the first transistor 210, a gate insulating film 1024 provided over the oxide semiconductor film 1020, and a gate electrode 1026 provided over the oxide semiconductor film 1020 with the gate insulating film 1024 interposed therebetween.

Note that a film from which oxygen is released by heat treatment is preferably used as the insulating film 1019. The reason for this is as follows: when oxygen vacancies exist in a channel formation region of the first transistor 210, electric charge is generated due to the oxygen vacancies in some cases. In general, part of oxygen vacancies in an oxide semiconductor film serves as a donor to release an electron which is a carrier. As a result, the threshold voltage of the transistor shifts in the negative direction.

When the insulating film 1019 is a film from which oxygen is released by heat treatment, part of oxygen in the oxygen supply film can be released by the heat treatment; therefore, the oxygen can be supplied to the oxide semiconductor film and oxygen vacancies in the oxide semiconductor film can be filled, which can suppress the shift of the threshold voltage of the transistor in the negative direction. In particular, the oxygen supply film preferably contains oxygen which exceeds at least the stoichiometric composition. For example, in the case where silicon oxide is used for the oxygen supply film, a film of silicon oxide represented by $SiO_{2+\alpha}$ ($\alpha>0$) is preferably used. Note that a region containing a larger amount of oxygen than the stoichiometric composition (hereinafter referred to as "an oxygen-excessive region" in some cases) may exist in at least part of the oxygen supply film.

Note that "to release oxygen by heat treatment" described above refers to the amount of oxygen which is released by heat up to 520° C. in thermal desorption spectroscopy (TDS) analysis and converted into oxygen atoms is greater than or equal to $1.0\times10^{19}$ atoms/cm$^3$, preferably greater than or equal to $3.0\times10^{19}$ atoms/cm$^3$, further preferably greater than or equal to $1.0\times10^{20}$ atoms/cm$^3$, still further preferably greater than or equal to $3.0\times10^{20}$ atoms/cm$^3$.

Here, a method to measure the amount of released oxygen using TDS analysis is described.

The amount of released gas in the TDS analysis is proportional to an area of a peak originating from ions of the gas. Therefore, the amount of the released gas can be calculated from the ratio between the peak area of a sample and that of a standard sample. The reference value of a standard sample refers to the ratio of the density of an atom contained in a sample to the area of the peak originating from the ions of the released gas.

For example, the amount of the released oxygen molecules ($N_{O2}$) from an insulating film can be obtained according to Formula 1 with the TDS analysis results of a silicon wafer containing hydrogen at a known density which is the standard sample and the TDS analysis results of the insulating film which is the measurement sample. Here, all ions having a mass-to-charge ratio (M/z) of 32 which are detected by the TDS analysis are assumed to originate from an oxygen molecule. Although $CH_3OH$ can also be given as a molecule having M/z of 32, it is not taken into consideration on the assumption that it is unlikely to be present. Further, oxygen molecules including an isotope of an oxygen atom having M/z of 17 or 18 which is an isotope of an oxygen atom are also not taken into consideration because the proportion of such molecules in the natural world is minimal $$N_{O2} = \frac{N_{H2}}{S_{H2}} \times S_{O2} \times a \quad (1)$$

A value obtained by conversion of the amount of hydrogen molecules desorbed from the standard sample into densities is denoted by $N_{H2}$. The peak area of the hydrogen ion detected in the case of the standard sample is denoted by $S_{H2}$. Here, $N_{H2}/S_{H2}$ is a reference value of the standard sample. The peak area of the oxygen ion detected in the case of the insulating film is denoted by $S_{O2}$. $\alpha$ is a coefficient which influences spectrum intensity in the TDS analysis. Refer to Japanese Published Patent Application No. H06-275697 for details of the Formula 1. Note that the measurement can be carried out with a thermal desorption spectroscopy apparatus produced by ESCO Ltd., EMD-WA1000S/W using a silicon wafer containing hydrogen atoms at $1 \times 10^{16}$ atoms/cm$^2$ as the standard sample, for example.

In the TDS analysis, oxygen is partly detected as an oxygen atom. The ratio between oxygen molecules and oxygen atoms can be calculated from the ionization rate of the oxygen molecules. Since the constant $\alpha$ includes the ionization rate of the oxygen molecules, the amount of the released oxygen atoms can also be estimated from the amount of the released oxygen molecules.

Note that $N_{O2}$ is the amount of the released oxygen molecules. The amount of the released oxygen when converted into oxygen atoms is twice the number of the released oxygen molecules.

For the introduction of oxygen into the insulating film 1019, heat treatment performed under an oxygen atmosphere, an ion implantation method, an ion doping method, a plasma immersion ion implantation method, plasma treatment performed under an atmosphere containing oxygen, or the like can be employed.

Further, in the case where the hydrogen concentration in an insulating film 1019 is greater than or equal to $7.2 \times 10^{20}$ atoms/cm$^3$, variation in initial characteristics of the transistor is increased, an L length dependence of electrical characteristics of the transistor is increased, and the transistor is significantly degraded by external stress; therefore, the hydrogen concentration in the insulating film 1019 is preferably controlled to be less than $7.2 \times 10^{20}$ atoms/cm$^3$.

Note that in the case where oxygen is supplied from the oxygen supply film to the oxide semiconductor film by heat treatment, it is preferable that a film having a low oxygen or water vapor permeability (also referred to as a low moisture permeability) be formed under the oxygen supply film (that is, on a surface of the oxygen supply film opposite to the surface in contact with the oxide semiconductor film) so that oxygen released from the oxygen supply film can be supplied to the oxide semiconductor film efficiently. For example, under the oxygen supply film, an aluminum oxide film, an aluminum oxynitride film, an aluminum nitride oxide film, or the like may be formed as a barrier film. In the case of using an aluminum oxide film, the aluminum oxide film preferably has a high density (film density of higher than or equal to 3.2 g/cm$^3$, preferably higher than or equal to 3.6 g/cm$^3$).

An oxide semiconductor material used for the oxide semiconductor film 1020 contains at least indium (In). In particular, In and zinc (Zn) are preferably contained. In addition, as a stabilizer for reducing the variation in electric characteristics of a transistor using the oxide semiconductor, gallium (Ga) is preferably included in addition to In and Zn. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

As another stabilizer, one or a plurality of kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, any of the following can be used: indium oxide, tin oxide, zinc oxide, an In—Zn-based oxide, an In—Mg-based oxide, an In—Ga-based oxide, an In—Ga—Zn-based oxide (also referred to as IGZO), an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Note that here, for example, an "In—Ga—Zn-based oxide" means an oxide containing In, Ga, and Zn as its main components and there is no particular limitation on the ratio of In, Ga, and Zn. The In—Ga—Zn-based oxide may contain a metal element other than the In, Ga, and Zn.

Alternatively, a material represented by $InMO_3(ZnO)_m$ (m>0 is satisfied, and m is not an integer) may be used as an oxide semiconductor. Note that M represents one or more metal elements selected from Ga, Fe, Mn, and Co. Alternatively, as the oxide semiconductor, a material expressed by a chemical formula, $In_2SnO_5(ZnO)_n$ (n>0, n is an integer) may be used.

A structure of the oxide semiconductor film that can be used in the oxide semiconductor film 1020 will be described below.

In this specification, a term "parallel" indicates that the angle formed between two straight lines is greater than or equal to $-10°$ and less than or equal to $10°$, and accordingly also includes the case where the angle is greater than or equal to $-5°$ and less than or equal to $5°$. In addition, a term "perpendicular" indicates that the angle formed between two straight lines is greater than or equal to $80°$ and less than or equal to $100°$, and accordingly includes the case where the angle is greater than or equal to $85°$ and less than or equal to $95°$.

In this specification, the trigonal and rhombohedral crystal systems are included in the hexagonal crystal system.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

In a transistor using the CAAC-OS film, change in electric characteristics due to irradiation with visible light or ultraviolet light is small. Thus, the transistor has high reliability.

Note that an oxide semiconductor film may be a stacked film including two or more films of an amorphous oxide semiconductor film, a microcrystalline oxide semiconductor film, and a CAAC-OS film, for example.

In the case where the CAAC-OS film is deposited as the oxide semiconductor film 1020, any of the following three methods may be employed. The first is a method in which an oxide semiconductor film is deposited at a temperature higher than or equal to 200° C. and lower than or equal to 450° C. by a PVD method such as a sputtering method. Thus, a CAAC-OS film can be formed. The second is a method in which after an oxide semiconductor film is deposited by a PVD method such as a sputtering method, heat treatment is performed on the oxide semiconductor film at a temperature higher than or equal to 200° C. and lower than or equal to 700° C. Thus, a CAAC-OS film can be formed. The third is a method in which an oxide semiconductor film having two layers is deposited by a PVD method such as a sputtering method. After a first oxide semiconductor film with a small thickness is deposited, heat treatment is performed on the oxide semiconductor film at a temperature higher than or equal to 200° C. and lower than or equal to 700° C., so that the first oxide semiconductor film which is a CAAC-OS film is formed. Then, film deposition for the second layer over the first oxide semiconductor film is performed using a crystal in the first oxide semiconductor film as a seed crystal, whereby a second oxide semiconductor film which is a CAAC-OS film is obtained.

Note that since it is preferable that oxygen vacancies in the oxide semiconductor film 1020 be reduced as much as possible, it is preferable that the oxide semiconductor film 1020 be deposited in a deposition atmosphere in which an oxygen gas accounts for a large proportion; therefore, it can be said that it is preferable to use a sputtering apparatus into which oxygen can be introduced and in which the gas flow rate can be adjusted. Further, 90% or more of the gas introduced into a deposition chamber of the sputtering apparatus is an oxygen gas, and in the case where another gas is used in addition to the oxygen gas, a rare gas is preferably used. Further, it is more preferable that the gas introduced into the deposition chamber be only an oxygen gas and the percentage of an oxygen gas in the deposition atmosphere be as closer to 100% as possible.

Further, when the oxide semiconductor film 1020 contains a large amount of hydrogen, the hydrogen and an oxide semiconductor are bonded to each other, so that part of the hydrogen serves as a donor and causes generation of an electron which is a carrier. As a result, the threshold voltage of the transistor shifts in the negative direction. Accordingly, the hydrogen concentration in the oxide semiconductor film 1020 is preferably lower than $5\times10^{18}$ atoms/cm$^3$, further preferably lower than or equal to $1\times10^{18}$ atoms/cm$^3$, still further preferably lower than or equal to $5\times10^{17}$ atoms/cm$^3$, further preferably lower than or equal to $1\times10^{16}$ atoms/cm$^3$. Note that the concentration of hydrogen in the oxide semiconductor film 1020 is measured by secondary ion mass spectrometry (SIMS).

For the above-described reason, it is preferable that the gas used for deposition of the oxide semiconductor film 1020 do not contain an impurity such as water, hydrogen, a hydroxyl group, or hydride. Further, it is preferable to use a gas having a purity greater than or equal to 6N, preferably greater than or equal to 7N (i.e., the impurity concentration in the gas is less than or equal to 1 ppm, preferably less than or equal to 0.1 ppm).

Further, in deposition of the oxide semiconductor film 1020, in order to remove moisture (including water, water vapor, hydrogen, a hydroxyl group, or hydride) in the deposition chamber, an entrapment vacuum pump such as a cryopump, an ion pump, or a titanium sublimation pump is preferably used. The evacuation unit may be a turbo molecular pump provided with a cold trap. By using a cryopump, a hydrogen atom, a compound containing a hydrogen atom such as water ($H_2O$) (preferably, also a compound containing a carbon atom), and the like are removed. Accordingly, the concentration of impurities such as hydrogen or moisture in the oxide semiconductor film 1020 can be reduced.

Note that the oxide semiconductor film 1020 may have a structure in which a plurality of oxide semiconductor films are stacked. For example, the oxide semiconductor film 1020 may be a stack of the first oxide semiconductor film, the second oxide semiconductor film, and the third oxide semiconductor film, which each have different constituent elements.

Further, the constituent elements of the first oxide semiconductor film, the second oxide semiconductor film, and the third oxide semiconductor film may be the same and the compositions of the constituent elements of the first oxide semiconductor film, the second oxide semiconductor film, and the third oxide semiconductor film may be different from one another. For example, the first oxide semiconductor film and the third oxide semiconductor film may have an atomic ratio of In:Ga:Zn=1:1:1, and the second oxide semiconductor film may have an atomic ratio of In:Ga:Zn=3:1:2. Alternatively, the first oxide semiconductor film and the third oxide semiconductor film may each have an atomic ratio of In:Ga:Zn=1:3:2, and the second oxide semiconductor film may have an atomic ratio of In:Ga:Zn=3:1:2.

At this time, the second oxide semiconductor film preferably contains more In than Ga. Further, the first oxide semiconductor film and the third oxide semiconductor film preferably contain In and Ga at a proportion of In≤Ga.

In an oxide semiconductor, the s orbital of heavy metal mainly contributes to carrier transfer, and overlap of the s orbitals is likely to increase when the In content in the oxide semiconductor is increased. Therefore, an oxide having a composition of In>Ga has higher mobility than an oxide having a composition of In≤Ga. Further, in Ga, the formation energy of oxygen vacancies is larger and thus oxygen vacancies are less likely to occur, than in In; therefore, the oxide having a composition of In≤Ga has more stable characteristics than the oxide having a composition of In>Ga.

An oxide semiconductor having a composition of In>Ga is applied to the second oxide semiconductor film which is not in contact with the insulating film 1019 or the gate insulating film 1024, and an oxide semiconductor having a composition of In≤Ga is applied to the first oxide semiconductor film or the third oxide semiconductor film which is in contact with the insulating film 1019 or the gate insulating film 1024, whereby mobility and reliability of a transistor can be increased.

A material and formation method used for the gate insulating film 1024 and the gate electrode 1026 are not particularly limited and known techniques can be used.

Note that at least a film of the gate electrode 1026 in contact with the gate insulating film 1024 is preferably a film of a material having a work function higher than that of a material of the oxide semiconductor film 1020. As the film, a metal oxide film containing nitrogen such as an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film or the like can be used. These films each have a work function higher than or equal to 5 eV (electron volts), preferably higher than or equal to 5.5 eV (electron volts); thus, when these are used for the gate electrode, the threshold voltage of the transistor can be positive. Accordingly, what is called a normally-off switching element can be provided. In this embodiment, the first transistor 210 corresponds to the normally-off switching element.

Note that as shown in FIG. 10A, a plurality of interlayer films (interlayer films 1014 and 1018) or a conductive film (conductive film 1016) may be formed between the layer where the second transistor 212 and the third transistor 214 are formed and the layer where the first transistor 210 is formed.

Further, as shown in FIG. 10A, a plurality of interlayer films (interlayer films 1028, 1032, 1036, and 1040) or a plurality of conductive films (conductive films 1030, 1034, and 1038) may be formed over the first transistor 210.

In the case of using an OS transistor as the first transistor 210, conductive films (or wiring layers) can be provided over and under the OS transistor; thus, the degree of flexibility in the circuit configuration can be increased.

Note that the first transistor 210 described above includes the conductive film 1022 serving as the source or the drain and the gate electrode 1026 over the oxide semiconductor film 1020, which is what is called a top-gate top-contact (TGTC) structure; however, the structure of the first transistor 210 is not limited to this structure.

For example, the first transistor 210 may have a top-gate bottom-contact (TGBC) structure in which the conductive film 1022 serving as the source or the drain is formed under the oxide semiconductor film 1020.

Figure 10B:
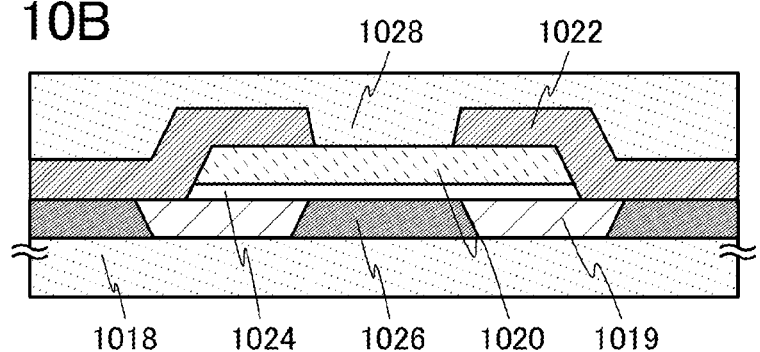

Further, as shown in FIG. 10B, the first transistor 210 may include the gate electrode 1026 under the oxide semiconductor film 1020 with the gate insulating film 1024 interposed therebetween, which is a bottom-gate top-contact (BGTC) structure. Further, the first transistor 210 may include the conductive film 1022 serving as the source or the drain under the oxide semiconductor film 1020 in FIG. 10B, which is a bottom-gate bottom-contact (BGBC) structure.

Figure 10C:
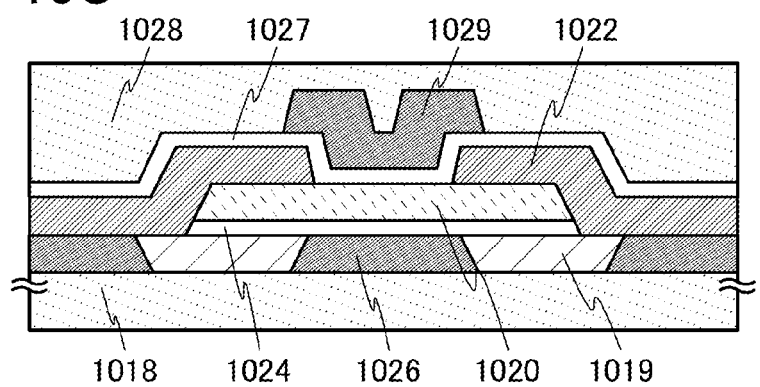

Furthermore, as shown in FIG. 10C, the first transistor 210 may include a back gate electrode 1029 over the oxide semiconductor film 1020 with an insulating film 1027 interposed therebetween. With the structure including the back gate electrode 1029, even when the first transistor 210 is in a normally-on state (here, the term "normally-on state" means that the transistor is turned on when application of a potential by a power source is not conducted), by appropriately applying a voltage to the back gate electrode 1029, the threshold voltage of the first transistor 210 can be shifted to keep the first transistor 210 in a normally-off state (here, the term "normally-off state" means that the transistor is turned off when application of a potential by a power source is not conducted).

⟨Method for Driving Memory Device⟩

Next, with reference to FIGS. 4A and 4B and FIGS. 5A and 5B, a method for driving the memory device illustrated in FIGS. 1A and 1B, FIG. 2, and FIGS. 3A and 3B will be described.

In the following description, (1) the signal writing operation by which a signal is written to the memory cell 120 from the input-output portion 108 and (2) the signal reading operation by which a signal is read from the memory cell 120 to the input-output portion 108 are described separately. Note that in the description given below, the memory cell 120 has the configuration illustrated in FIG. 3B where an OS transistor is used as a component and the storage function and the output function are separately provided. It is needless to say that the configuration of the memory cell 120 is not limited to this configuration.

⟨Signal Writing Operation⟩

First, the control circuit 104 selects whether the memory cell 120 in the memory circuit 102 is used as a single-level cell or a multi-level cell. Then, the selection circuit 106 outputs a signal that makes one of the first input path 130 and the second input path 140 in a conducting state and makes the other in a non-conducting state and a signal that makes one of the first output path 150 and the second output path 160 in a conducting state and the other in a non-conducting state.

Specifically, in the case of using the memory cell 120 in the memory circuit 102 as a multi-level cell, a multi-bit digital signal output from the input-output portion 108 needs to be converted into an analog signal by the D/A converter 134, and in addition, a signal output from the memory cell 120 needs to be converted into a multi-bit digital signal by the A/D converter 154. Accordingly, the first input path 130 and the first output path 150 are selected as the signal transmission path (corresponding to thick solid line in FIG. 4A) by turning on the first switching element 132 and the third switching element 152 and turning off the second switching element 142 and the clocked inverter 180 (corresponding to the fourth switching element 162).

In the case of using the memory cell 120 in the memory circuit 102 as a single-level cell, signal conversion using the D/A converter 134 and the A/D converter 154 is unnecessary. Accordingly, the second input path 140 and the second output path 160 are selected as the signal transmission path (corresponding to thick solid line in FIG. 4B) by turning on the second switching element 142 and the clocked inverter 180 (corresponding to the fourth switching element 162) and turning off the first switching element 132 and the third switching element 152.

The above-described operation of selecting the signal transmission path is conducted in the plurality of memory circuits 102. This selection of the signal transmission path is conducted on a group (or block) basis: for example, the memory circuits from the first row to the third row are determined to be used as single-level cell memory circuits and the memory circuits from the fourth row to the sixth row are determined to be used as multi-level cell memory circuits.

In parallel to the selection of the signal transmission path, the input-output portion 108 outputs a single-bit digital signal or a multi-bit digital signal to the input signal line 110 on an instruction from the control circuit 104.

In the case of using the memory cell 120 in the memory circuit 102 as a multi-level cell, the first input path 130 in which the D/A converter 134 lies is selected, and the multi-bit digital signal output from the input-output portion 108 is converted into an analog signal by the D/A converter 134 and then input to the memory cell 120. In the case of using the memory cell 120 in the memory circuit 102 as a single-level cell, a single-bit digital signal output from the input-output portion 108 is input to the memory cell 120 through the second input path 140 without passing through the D/A converter 134.

In the case of using the memory cell 120 in the memory circuit 102 as a single-level cell, power supply to the D/A converter 134 can be stopped in the memory device 100; accordingly, power consumption of the memory device 100 can be reduced.

Further in the case of using the memory cell 120 in the memory circuit 102 as a single-level cell, a single-bit digital signal output from the input-output portion 108 can be directly input to the memory cell 120 without passing through the D/A converter 134 (i.e., without being subjected to data conversion operation at the D/A converter 134); accordingly, driving speed of the memory device 100 can be increased.

By using an OS transistor including an oxide semiconductor material in its active layer as the first transistor 210 that is a component of the memory cell 120, a signal from the input-output portion 108 can be stored for a long time in the node 218 under conditions where the first transistor 210 is turned off after being turned on to write the signal to the node 218.

In the above-described manner, the signal writing operation is conducted.

Note that verify operation may be conducted as necessary after the above signal writing operation is conducted.

⟨Signal Reading Operation⟩

By storing the signal in the node 218, a voltage of the signal stored in the node 218 is applied to the gate of the second transistor 212, so that the second transistor 212 is turned on.

At this time, because a signal from the signal supply portion 220 is input to one of the source and the drain of the second transistor 212, the first signal that is based on the signal (or the voltage of the signal) stored in the node 218 is output from the other of the source and the drain of the second transistor 212 during the period in which the signal is stored in the node 218.

It is preferable to make the application voltage to the signal supply portion 220 different between the case of using the memory cell 120 in the memory circuit 102 as a single-level cell and the case of using the memory cell 120 in the memory circuit 102 as a multi-level cell. The reason is described with reference to FIGS. 5A and 5B.

Figure 5A:
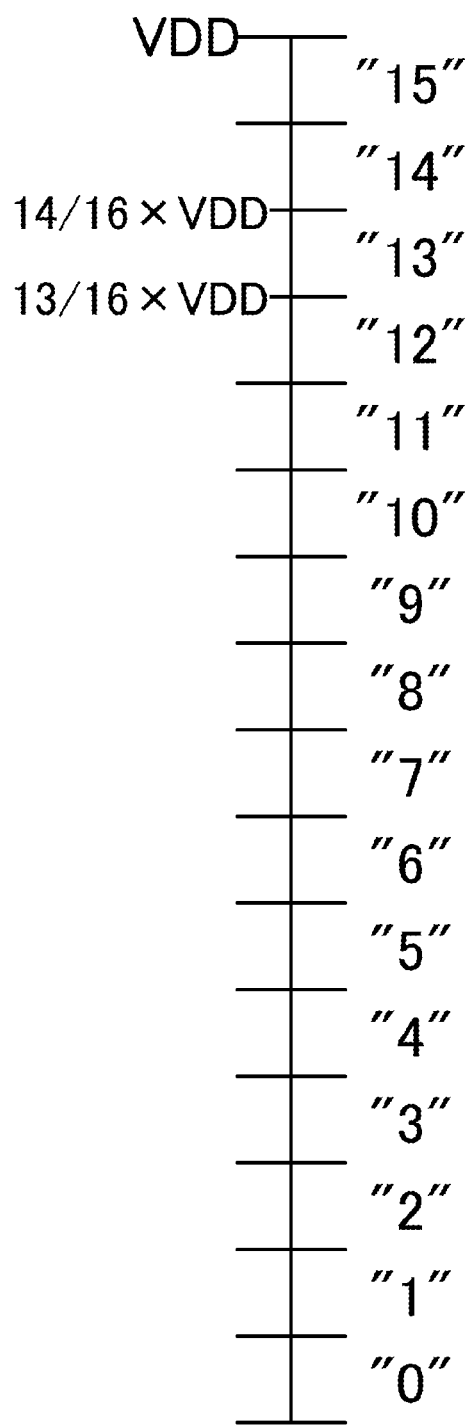
FIGS. 5A and 5B each illustrate a memory concept of a memory cell.
Figure 5B:
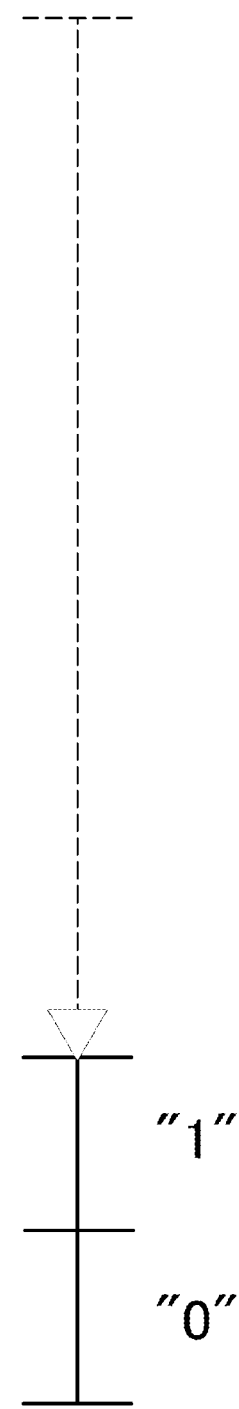

FIG. 5A illustrates the concept of the application voltage to the signal supply portion 220 and the first signal output from the memory cell 120 (or the second transistor 212) in the case of using the memory cell 120 as a multi-level cell and FIG. 5B illustrates the concept in the case of using the memory cell 120 as a single-level cell. Note that in this embodiment, 4-bit data is stored in one memory cell in the case of using the memory cell 120 as the multi-level cell.

FIG. 5A illustrates the case of using the memory cell 120 as a multi-level cell in which 4-bit data is stored in one cell. The memory cell 120 needs to output the first signal in 16 levels (or 16 ranges) (voltages corresponding to signals "0" to "15") in accordance with the magnitude of the signal (the voltage of the signal) in the node 218. In order to output a precise first signal even under conditions where a variation in characteristics of a transistor or a change in the voltage of the stored signal occurs, some amount of margin separating the voltage ranges is necessary. For example, in order to output a signal "13" as the first signal even under conditions where a variation in characteristics of a transistor or a change in the voltage of the stored signal occurs, the voltage of the first signal needs to stay within the range from higher than 13/16×VDD to lower than 14/16×VDD. For this reason, a high application voltage to the signal supply portion 220 is necessary.

FIG. 5B illustrates the case of using the memory cell 120 as a single-level cell. The memory cell 120 only needs to output the first signal in either of 2 states (or 2 ranges) (voltages corresponding to signals "0" and "1") in accordance with the magnitude of the signal (the voltage of the signal) in the node 218. Accordingly, the precise first signal can be output even when the application voltage to the signal supply portion 220 is lower than that in the case of using the memory cell 120 as a multi-level cell (this concept corresponds to a dotted arrow in FIG. 5B). Note that the application voltage to the signal supply portion 220 in the case of using the memory cell 120 as a single-level cell may be lower than the application voltage to the signal supply portion 220 in the case of using the memory cell 120 as a multi-level cell.

Whether the application voltage to the signal supply portion 220 is VDD or a voltage lower than VDD can be determined based on, for example, the signal output to the input-output portion 108 from the control circuit 104 (the signal that gives instructions to select which signal to use as the signal output from the input-output portion 108, a single-bit digital signal or a multi-bit digital signal).

Alternatively, it can be determined based on the signal output from the selection circuit 106 to the memory circuit 102.

In this manner, in the case of using the memory cell 120 as a multi-level cell, the application voltage to the signal supply portion 220 is set to be VDD, and in the case of using the memory cell 120 as a single-level cell, the application voltage to the signal supply portion 220 can be set to be lower than VDD. This can reduce power consumption of the memory device 100.

Then, by turning on the third transistor 214 on an instruction for reading operation from the driver circuit 116 through the word line 118, the first signal output from the other of the source and the drain of the second transistor 212 is output from the memory cell 120. The first signal output from the third transistor 214 is supposedly not completely the same as and slightly different from the first signal output from the second transistor 212. However, the first signal output from the third transistor 214 and the first signal output from the second transistor 212 can be regarded as the same as long as they can be identified as the same signal (the signals representing the same data) when they are input to the input-output portion 108.

In the case of using the memory cell 120 in the memory circuit 102 as a multi-level cell, the first output path 150 is selected, the first signal output from the memory cell 120 is converted into a multi-bit digital signal by the A/D converter 154, and the multi-bit digital signal is input to the output signal line 112 and then input to the input-output portion 108. In the case of using the memory cell 120 in the memory circuit 102 as a single-level cell, the second output path 160 without the A/D converter 154 is selected, and the first signal from the memory cell 120 is directly output to the output signal line 112 and input to the input-output portion 108.

Thus, in the case of using the memory cell 120 in the memory circuit 102 as a single-level cell, since the signal does not pass through the A/D converter 154, power supply to the A/D converter 154 can be stopped. Accordingly, power consumption of the memory device 100 can be reduced.

Further in the case of using the memory cell 120 in the memory circuit 102 as a single-level cell, the first signal output from the memory cell 120 does not need to be converted at the A/D converter 154 and can be directly input to the input-output portion 108. Accordingly, higher driving speed of the memory device 100 can be achieved.

In the above-described manner, the signal reading operation is conducted.

Effects of this Embodiment

With the structure of the memory device 100 that can switch the signal transmission path in such a manner that the signal transmission path in which the D/A converter 134 and the A/D converter 154 lie is selected in the case of using the memory cell 120 as a multi-level cell and the signal transmission path in which the D/A converter 134 and the A/D converter 154 do not lie is selected in the case of using the memory cell 120 as a single-level cell, one memory cell can operate in both a single-level cell mode and a multi-level cell mode.

In the case of using the memory cell 120 as a single-level cell, the signal does not need to pass through the D/A converter 134 and the A/D converter 154; accordingly, the memory device 100 can be driven at high speed.

In addition, in the case of using the memory cell 120 as a single-level cell, power supply to the D/A converter 134 and the A/D converter 154 can be stopped. Thus, lower power consumption of the memory device 100 can be achieved.

Further, the memory cell 120 has the structure including the storage function portion which stores an input signal, the signal supply portion 220 which outputs a signal used for generation of the first signal, and the output function portion which outputs the first signal that is based on the stored signal as illustrated in FIG. 3B; and as illustrated in FIGS. 5A and 5B, in the case of using the memory cell 120 as a multi-level cell, a VDD voltage is supplied from the signal supply portion 220, and in the case of using the memory cell 120 as a single-level cell, a voltage lower than VDD is supplied from the signal supply portion 220. With this structure, power consumption of the memory device 100 can be further reduced.

Embodiment 2

In this embodiment, a method for driving the memory device 100 described in Embodiment 1, which is different from the method in Embodiment 1, and advantages in using the driving method are described with reference to FIGS. 6A and 6B, FIGS. 7A and 7B, and FIG. 8.

When larger storage capacity is necessary in the case of using the memory cells 120 as single-level cells, the memory cells 120 need to change to a multi-level cell mode on a block basis (for example, the memory circuits 102 from the first row to the third row in the memory device 100 need to change from a single-level cell mode to a multi-level cell mode).

In the case of using the memory cell 120 as either a single-level cell or a multi-level cell as in Embodiment 1, in order to change the memory cell from a single-level cell mode to a multi-level cell mode, first, the single-bit data stored in the memory cell 120 needs to be temporarily relocated to another place (referred to as signal relocation operation), and then the data in the memory cell 120 needs to be erased (signal erasing operation). These operations consume time and power.

When the single-bit data signal is relocated to a memory cell that is different from the memory cell where the signal is originally stored by the signal relocation operation, a device including the memory device 100 needs to conduct operation of obtaining the place (address) which the single-bit data signal is relocated to and reconfiguring data based on the address data. This operation consumes time and power.

Further, an operation of checking whether the single-bit data signal is relocated to a memory device other than the memory device 100 needs to be conducted. This operation further consumes time and power.

For this reason, it is ideal to employ a method by which single-bit data written to (stored in) the memory cell 120 and newly-written multi-bit data are stored in the same memory cell 120.

In this embodiment, a method for storing single-bit data written to (stored in) the memory cell 120 and newly-written multi-bit data in the same memory cell 120 and a method for selectively reading the single-bit data or the multi-bit data from the data stored in the memory cell 120 are described. Although writing and reading in the methods are carried out using the memory cell 120 as a multi-level cell (e.g., 4-bit multi-level cell) basically, each multi-bit data includes single-bit data (1 bit) that represents one of two states of data and multi-bit data (e.g., 2 bits) that represents one of multi-state of data (e.g. four states of data).

⟨Method for Driving Memory Device⟩

A method for driving the memory device in this embodiment is described with reference to FIGS. 6A and 6B, FIGS. 7A and 7B, and FIG. 8. Note that the same structure of the memory device and the like as those in Embodiment 1 can be used in this embodiment, and detailed description thereof is omitted here.

The method for driving the memory device 100 is described below in three separate operations: (1) the storage mode selecting operation by which whether both single-bit data and multi-bit data are stored in one memory cell is determined; (2) the signal writing operation by which a signal including single-bit data and multi-bit data is written to the memory cell 120 from the input-output portion 108; and (3) the signal reading operation by which the signal including the single-bit data and the multi-bit data is read from the memory cell 120 to the input-output portion 108.

The following description is given on the assumption that single-bit data has already been stored in the memory cell 120.

⟨Storage Mode Selecting Operation⟩

There are some cases in which the driving method described in this embodiment by which "one memory cell functions as both a single-level cell and a multi-level cell" cannot be employed. For increasing the storage capacity of the memory device 100, it needs to be determined whether the memory cell 120 is used as an element that functions as both a single-level cell and a multi-level cell or an element that functions as only a multi-level cell.

First, when the need for increasing the storage capacity of the memory device 100 arises, it is examined how many states of data (how many bits of data) (e.g., 4 states of data (2 bits of data)) the memory cells 120 in the target block need to store to have necessary storage capacity. Then, the control circuit 104 determines whether the memory cells 120 can be used as the "elements that each function as both a single-level cell and a multi-level cell."

For example, memory cells 120 that can store n bits of data (any of $2^n$ states of data) are considered. If necessary storage capacity can be obtained in the case where multi-bit data that is newly written to the memory cells 120 is (n−2) or less bits of data ($2^{(n-2)}$-or-less-state data), the memory cells 120 can be used as the "elements that each function as both a single-level cell and a multi-level cell." On the other hand, in the case where necessary storage capacity cannot be attained unless the multi-bit data that is newly written to the memory cells 120 is more than (n−2) bits of data (more-than-$2^{(n-2)}$-state data), the memory cells 120 are used as the "elements that function as multi-level cells."

A case in which necessary storage capacity of the memory device 100 can be obtained in the case where the multi-bit data that is newly written to the memory cells 120 is (n−2) or less bits of data ($2^{(n-2)}$-or-less-state data), is described below.

For easy understanding of the concept of the driving method, the following description is given on the assumption that the memory cells 120 can store 4 bits of data (any of 16 states of data) and necessary storage capacity of the memory device 100 can be obtained in the case where the multi-bit data that is newly written to the memory cells 120 is 2 bits of data (any of 4 states of data). It is needless to say that the present invention is not limited to this example.

⟨Signal Writing Operation⟩

First, a multi-bit digital signal (4 bits) including single-bit data (1 bit) and multi-bit data (2 bits), which is to be written to the memory cells 120, is generated in the input-output portion 108.

Specifically, first, the single-bit data stored in the memory cell 120 is read to the input-output portion 108 through the second output path 160 and the output signal line 112, and this signal is converted into a digital signal. This digital signal is set in the most significant bit (the leftmost bit) of the multi-bit digital signal (4 bits) which is to be output from the input-output portion 108, and in addition, the second most significant bit is set to "0" (indicated by a dashed-dotted line in FIG. 6A). The second most significant bit is hereinafter referred to as the second bit. In the same manner, the bits lower than the second most significant bit are referred to as the third bit and the fourth bit in order.

Figure 6A:
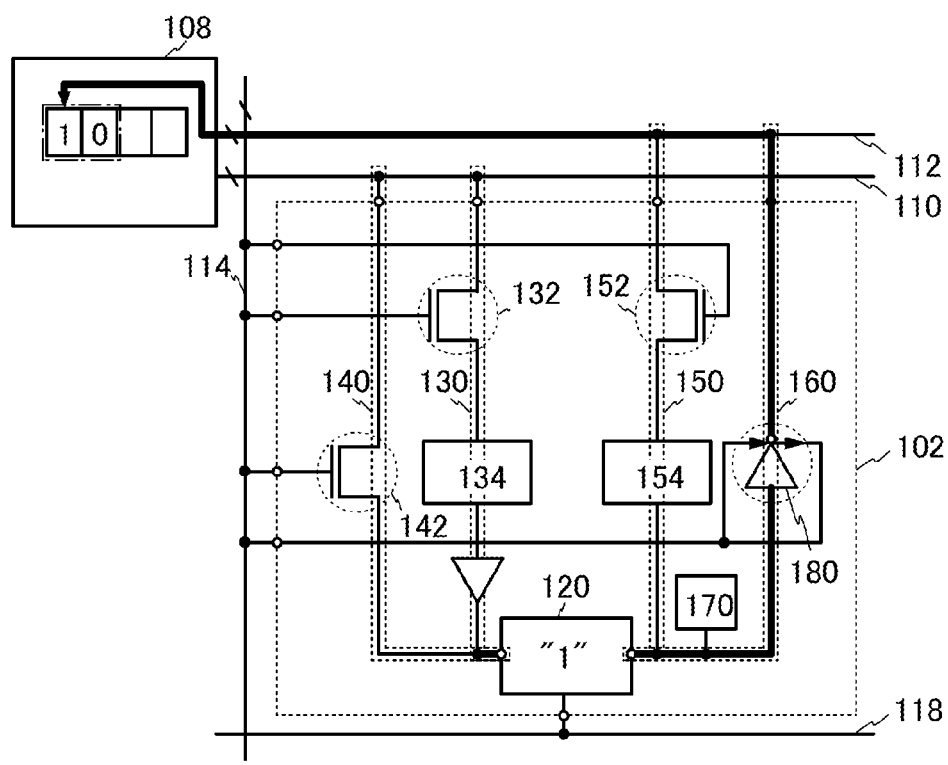
FIGS. 6A and 6B each illustrate an operation state of a memory circuit.
Figure 6B:
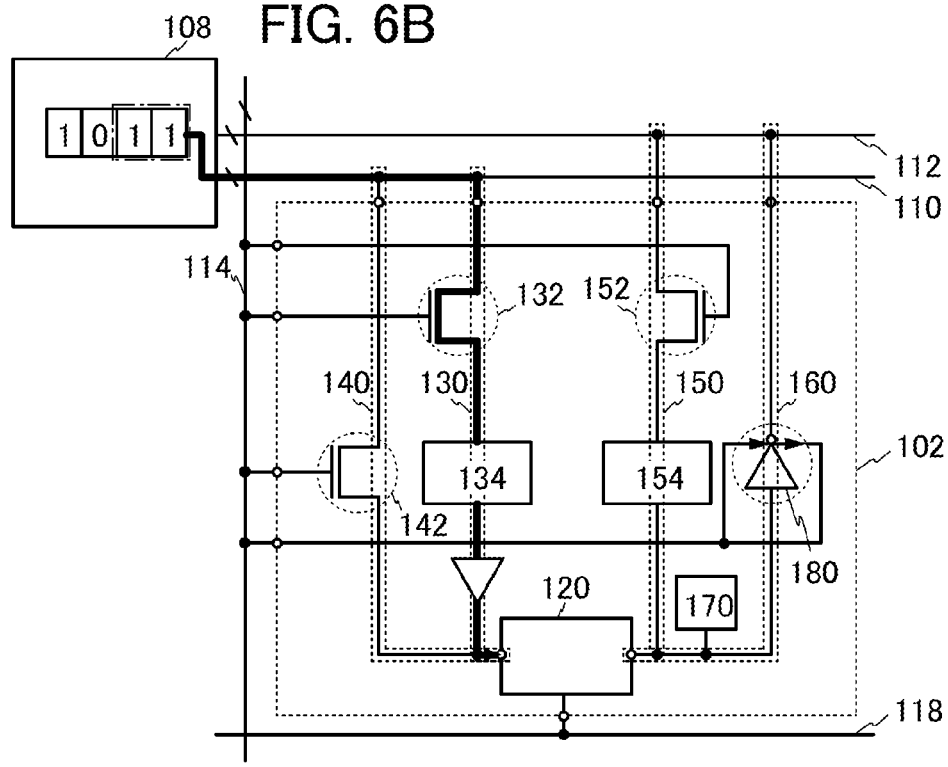

A signal (2 bits) newly written to the memory cell 120 is set in the third bit and the fourth bit of the multi-bit digital signal (4 bits) which is to be output from the input-output portion 108 (see FIG. 6B). This operation is indicated by a dashed-dotted line.

Thus, one feature of the method for driving the memory device described in this embodiment is that, in the above-described manner, one multi-bit digital signal (4 bits) consists of the most significant bit in which single-bit data (1 bit) that has already been stored in the memory cell 120 is set, one blank bit (corresponding to "0" in the second bit), and the third and fourth bits in which newly-added multi-bit data (2 bits) is set. Although details are described in ⟨Signal Reading Operation⟩, by using this method and by taking out the signal for the most significant bit (i.e., the signal representing the single-bit data (1 bit)) through the second output path 160 and taking out the signal for the lower bits than the second bit (i.e., the signal representing the multi-bit data (2 bits)) through the first output path 150, lower power consumption and higher-speed operation of the memory device 100 can be achieved.

Next, the multi-bit digital signal (4 bits) generated in the above-described manner is written to the memory cell 120 (or the node 218 in the memory cell 120) (see FIG. 6B). This operation is indicated by a thick line. For the writing operation, a method similar to the method for writing a multi-bit digital signal described in Embodiment 1 can be referred to.

In the above-described manner, the signal writing operation is conducted.

Note that verify operation may be conducted as necessary after the above signal writing operation is conducted.

⟨Signal Reading Operation⟩

Since the signal is stored in the node 218, a voltage of the signal stored in the node 218 is applied to the gate of the second transistor 212, which turns on the second transistor 212. Then, in the same manner as that in Embodiment 1, the first signal that is based on the signal stored in the node 218 (or the voltage of the signal) is output from the other of the source and the drain of the second transistor 212.

A feature of the method for driving the memory device described in this embodiment lies in this first signal. The feature of the first signal in this embodiment is described below with reference to FIGS. 7A and 7B and FIG. 8 by making comparison with the first signal including multi-bit data described in Embodiment 1.

Figure 7A:
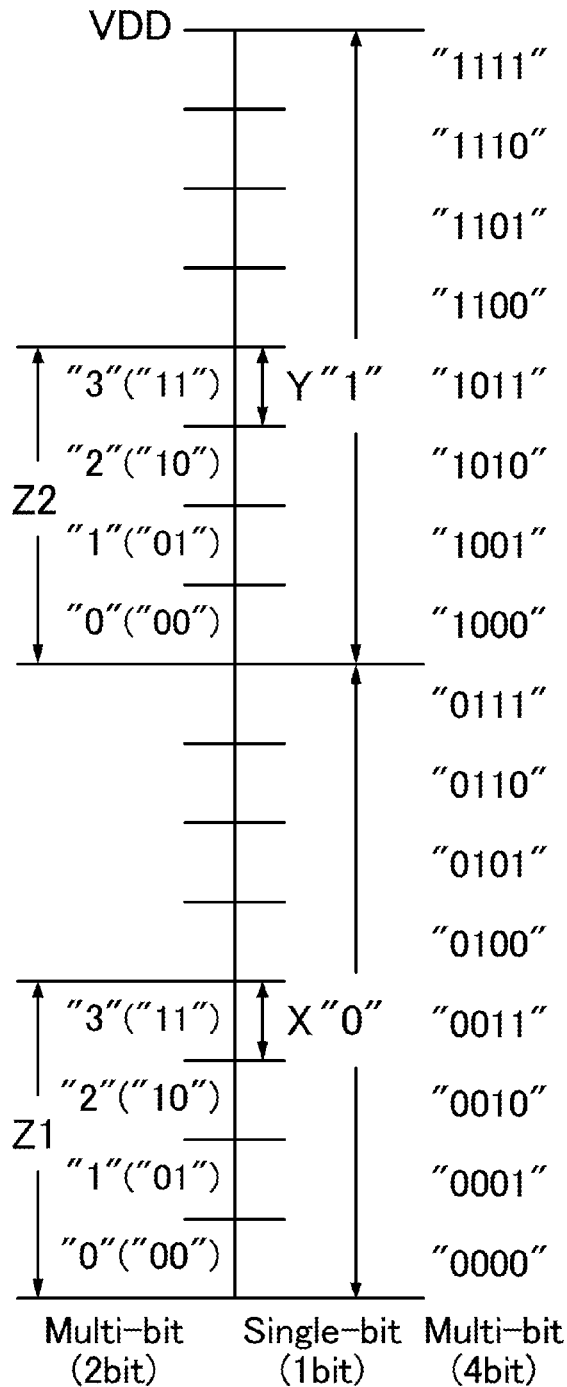
FIGS. 7A and 7B each illustrate a memory concept of a memory cell.

FIG. 7A is a conceptual diagram illustrating the voltage (VDD) applied to the signal supply portion 220 and the first signal output from the memory cell 120 (or the second transistor 212) in this embodiment. The feature of the first signal in this embodiment lies in that in each of the voltage ranges representing "0" and "1" of single-bit data (1 bit), voltage ranges representing "0" to "3" ("00" to "11") of multiple-bit data (2 bits) are further set.

With the above-described feature of the first signal that is based on the single-bit data (1 bit) and the multi-bit data (2 bits) stored in the memory cell 120, in the case where single-bit data "0" and multi-bit data "3" ("11") are stored in the memory cell 120 for example, the first signal is in the range X in FIG. 7A (corresponding to a multi-bit digital signal "3" ("0011")). In the case where single-bit data (1 bit) "1" and multi-bit data (2 bits) "3" ("11") are stored in the memory cell 120, the first signal is in the range Y in FIG. 7A (corresponding to a multi-bit digital signal "11" ("1011")).

Then, in the case of reading multi-bit data (2 bits) from the memory cell 120, the data is read through the first output path 150 in which the A/D converter 154 lies. In this way, multi-bit digital data representing multi-bit data (2 bits) "3" ("11") can be read to the input-output portion 108.

Further, in the case of reading single-bit data (1 bit) from the memory cell 120, there is an enough voltage difference between the range X representing "0" and the range Y representing "1". Accordingly, by reading the data through the second output path 160 in which the A/D converter 154 does not lie, single-bit digital data representing single-bit data "0" or "1" can be precisely read to the input-output portion 108.

Here, adverse effects caused in the case of storing both single-bit data (1 bit) and multi-bit data (4 bits) in one memory cell 120 in the driving method described in Embodiment 1 are described.

Figure 7B:
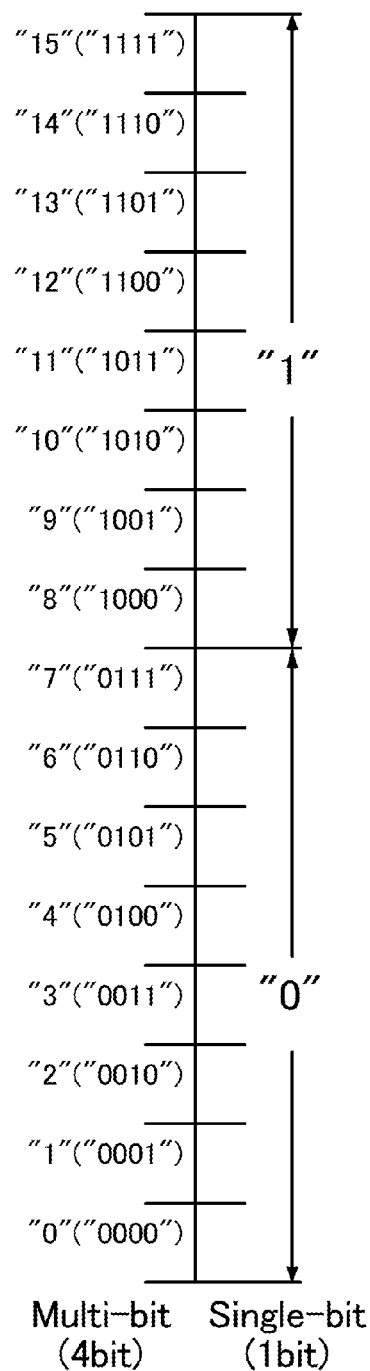

FIG. 7B is the same as FIG. 5A in Embodiment 1 and illustrates the concept of the application voltage to the signal supply portion 220 and the first signal output from the memory cell 120.

For example, even when the voltage range is divided in two as illustrated in FIG. 7B in order to store single-bit data (1 bit) "0" or "1", the voltage range representing multi-bit data (4 bits) "3" ("0011") does not exist in the voltage range representing single-bit data (1 bit) "1"; accordingly, the precise first signal cannot be output.

Figure 8:
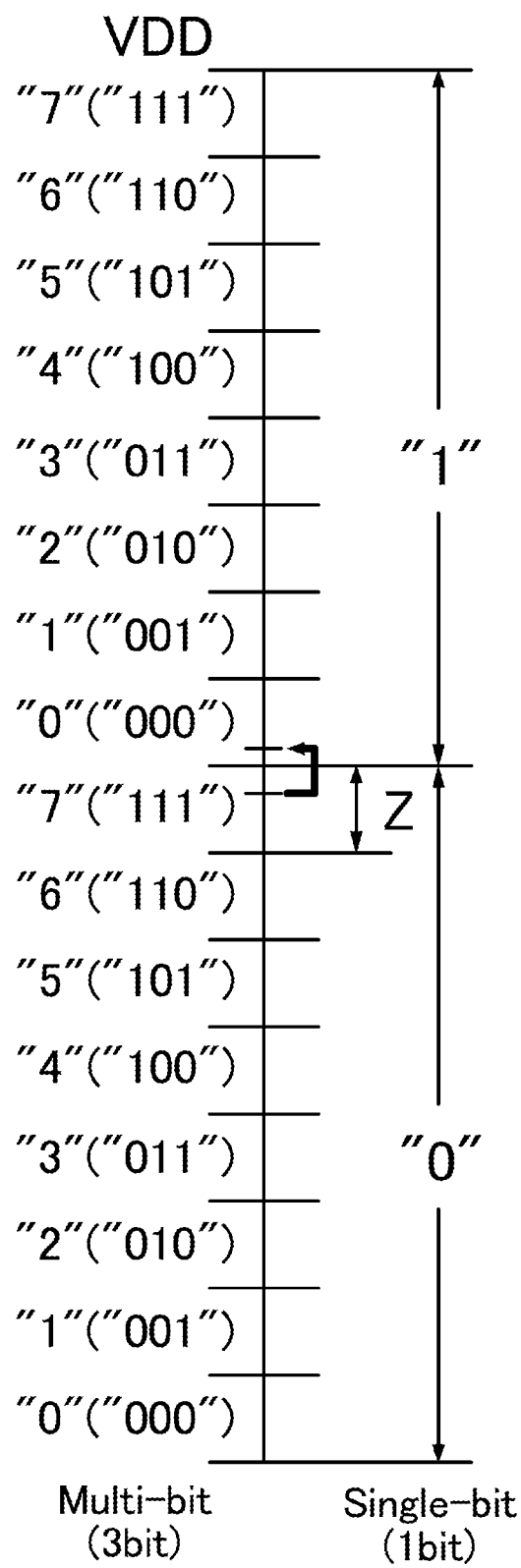
FIG. 8 illustrates a memory concept of a memory cell.

In the case where the operation of setting the second bit to "0" is performed as in this embodiment under the conditions where the memory cell 120 can store 4 bits of data, only 2 bits of multi-bit data can be added newly; however, there is a sufficient distance between the maximum voltage of a range Z1 and the minimum voltage of a range Z2 as illustrated in FIG. 7A, and accordingly the accuracy in reading data can be high. In the case where the operation of setting the second bit to "0" is not performed, 3 bits of multi-bit data can be added newly as illustrated in FIG. 8; however, a voltage range Z representing multi-bit data "7" ("111") does not have an enough margin, and accordingly different data may be output when a slight variation in the first signal is caused.

In consideration of this problem, it is preferable to perform the operation of setting the second bit to "0". Note that the operation of setting the second bit may set the second bit to "1" instead of setting the second bit to "0".

This is the feature of the first signal of this embodiment.

Then, the first signal which is output from the other of the source and the drain of the second transistor 212 is output from the memory cell 120 when the reading operation is instructed and the third transistor 214 is turned on.

Then, in the case of reading the multi-bit data (2 bits) of the multi-bit digital signal (4 bits) stored in the memory cell 120, the first signal output from the memory cell 120 is read through the first output path 150 in which the A/D converter 154 lies. In this way, the multi-bit digital data representing the multi-bit data (2 bits) can be read to the input-output portion 108.

Further, in the case of reading the single-bit data (1 bit) of the multi-bit digital signal (4 bits) stored in the memory cell 120, the voltage ranges representing single-bit data and multi-bit data (corresponding to Z1 and Z2) have an enough voltage difference therebetween as described in the description with reference to FIG. 7A. Accordingly, regardless of the multi-bit data (2 bits), a precise single-bit data (1 bit) can be read from the signal (voltage) output from the memory cell 120. Thus, by reading the data through the second output path 160 in which the A/D converter 154 does not lie, the single-bit digital data representing single-bit data "0" or "1" can be precisely read to the input-output portion 108.

In the case of reading only single-bit data (1 bit) written to the memory cell 120, the data does not need to pass through the A/D converter 154 as described above; accordingly, the memory device 100 can be driven at high speed. In addition, power supply to the A/D converter 154 can be stopped. Thus, lower power consumption of the memory device 100 can be achieved.

In the above-described manner, the signal reading operation is conducted.

Effects of this Embodiment

In the method for driving the memory device in this embodiment, one multi-bit digital signal is generated to consist of single-bit data that has already been stored in the memory cell 120 and newly-added multi-bit data, with one blank bit (corresponding to "0" in the second bit) interposed between the single-bit data and the multi-bit data, and is written to the memory cell 120. Then, in the case of reading the multi-bit data, the first signal that is based on the signal is read through the first output path 150 in which the A/D converter 154 lies. In the case of reading only the single-bit data, the first signal is read through the second output path 160 in which the A/D converter 154 does not lie.

With this driving method, single-bit data and multi-bit data can be stored in one memory cell 120 at the same time. Further, in the case of reading only single-bit data, higher-speed operation and lower power consumption of the memory device 100 can be achieved.

Embodiment 3

A memory device disclosed in this specification can be applied to a variety of electronic devices (including game machines). Examples of the electronic devices include display devices of televisions, monitors, and the like, lighting devices, desktop information terminals and notebook information terminals, word processors, image reproduction devices which reproduce still images or moving images stored in recording media such as digital versatile discs (DVDs), portable compact disc (CD) players, radio receivers, tape recorders, headphone stereos, stereos, cordless phone handsets, transceivers, portable wireless devices, cellular phones, car phones, portable game machines, calculators, portable information terminals, electronic notebooks, e-book readers, electronic translators, audio input devices, cameras such as video cameras and digital still cameras, electric shavers, high-frequency heating appliances such as microwave ovens, electric rice cookers, electric washing machines, electric vacuum cleaners, air-conditioning systems such as air conditioners, dishwashers, dish dryers, clothes dryers, futon dryers, electric refrigerators, electric freezers, electric refrigerator-freezers, freezers for preserving DNA, smoke detectors, radiation counters, and medical equipment such as dialyzers. Further, the examples include industrial equipment such as guide lights, traffic lights, belt conveyors, elevators, escalators, industrial robots, and power storage systems. In addition, oil engines, moving objects driven by electric motors using power from the non-aqueous secondary batteries, and the like are also included in the category of electronic devices. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats or ships, submarines, helicopters, aircrafts, rockets, artificial satellites, space probes, planetary probes, spacecrafts, and the like. Specific examples of these electronic devices are illustrated in FIGS. 9A to 9E.

Figure 9A:
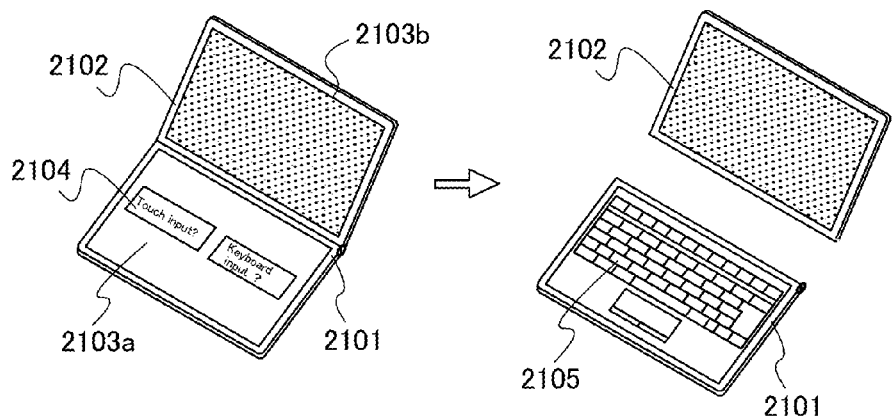
FIGS. 9A to 9E illustrate electronic devices each including a memory device.

FIG. 9A illustrates a portable information terminal which includes a housing 2101, a housing 2102, a first display portion 2103a, a second display portion 2103b, and the like. A memory device is incorporated as a part in the housing 2101 and the housing 2102. By employing the structure of the memory device and the driving method described in Embodiment 1 in the memory device, the portable information terminal can achieve low-power consumption and high-speed driving. By employing the driving method described in Embodiment 2, even when the need for increasing the storage capacity arises during software processing for example, the portable information terminal can achieve low-power consumption and high-speed driving.

At least one of the first display portion 2103a and the second display portion 2103b is a touch panel, and for example, as illustrated in the left in FIG. 9A, which of "touch input" and "keyboard input" is performed can be selected by selection buttons 2104 displayed on the first display portion 2103a. Since the selection buttons with a variety of sizes can be displayed, the portable information terminal can be easily used by people of any generation. In the case where "keyboard input" is selected, for example, a keyboard 2105 is displayed on the first display portion 2103a as illustrated in the right in FIG. 9A. Thus, letters can be input quickly by keyboard input as in the case of using a conventional information terminal.

In the portable information terminal illustrated in FIG. 9A, the housing 2101 provided with the first display portion 2103a and the housing 2102 provided with the second display portion 2103b can be separated as illustrated in the right part of FIG. 9A. Thus, the portable information terminal can be used as a lighter portable information terminal by detaching one of the housing 2101 and the housing 2102 as necessary.

The portable information terminal illustrated in FIG. 9A can have a function of displaying various kinds of information (e.g., a still image, a moving image, and a text image), a function of displaying a calendar, a date, the time, or the like on the display portion, a function of operating or editing the information displayed on the display portion, a function of controlling processing by various kinds of software (programs), and the like. Furthermore, an external connection terminal (an earphone terminal, a USB terminal, or the like), a recording medium insertion portion, and the like may be provided on the back surface or the side surface of the housing.

In addition, the portable information terminal illustrated in FIG. 9A may transmit and receive data wirelessly. Through wireless communication, desired book data or the like can be purchased and downloaded from an electronic book server.

Further, the housing 2101 or the housing 2102 illustrated in FIG. 9A may be equipped with an antenna, a microphone function, or a wireless communication function, so that the portable information terminal may be used as a mobile phone.

Figure 9B:
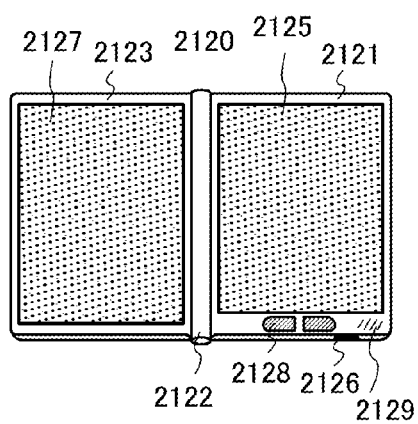

FIG. 9B illustrates an example of an e-book reader. For example, an e-book reader 2120 includes two housings of a housing 2121 and a housing 2123. The housing 2121 and the housing 2123 are combined with a hinge 2122 so that the e-book reader 2120 can be opened and closed with the hinge 2122 as an axis. With this structure, the e-book reader 2120 can operate like a paper book.

A display portion 2125 and a display portion 2127 are incorporated in the housing 2121 and the housing 2123, respectively. The display portion 2125 and the display portion 2127 may display one image or different images. In the case where the display portion 2125 and the display portion 2127 display different images, for example, text can be displayed on a display portion on the right side (the display portion 2125 in FIG. 9B) and images can be displayed on a display portion on the left side (the display portion 2127 in FIG. 9B).

A memory device is incorporated as a part in the housing 2121 and the housing 2123. By employing the structure of the memory device and the driving method described in Embodiment 1 in the memory device, the e-book reader 2120 can achieve low-power consumption and high-speed driving. By employing the driving method described in Embodiment 2, even when the need for increasing the storage capacity arises during software processing for example, the e-book reader 2120 can achieve low-power consumption and high-speed driving.

FIG. 9B illustrates an example in which the housing 2121 is provided with an operation portion and the like. For example, the housing 2121 is provided with a power switch 2126, an operation key 2128, a speaker 2129, and the like. The page can be turned with the operation key 2128. Note that a keyboard, a pointing device, or the like may also be provided on the surface of the housing, on which the display portion is provided. Furthermore, an external connection terminal (an earphone terminal, a USB terminal, or the like), a recording medium insertion portion, and the like may be provided on the back surface or the side surface of the housing. Further, the e-book reader 2120 may have a function of an electronic dictionary.

The e-book reader 2120 may be configured to transmit and receive data wirelessly. Through wireless communication, desired book data or the like can be purchased and downloaded from an electronic book server.

Figure 9C:
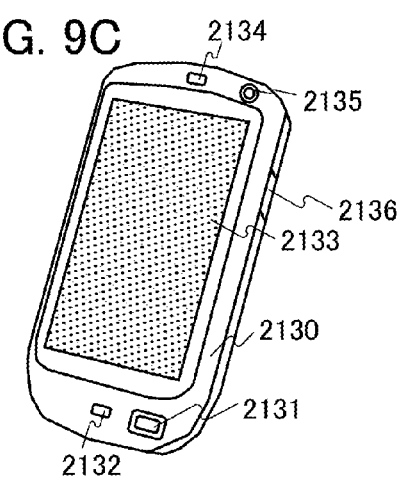

FIG. 9C illustrates a smartphone, which includes a housing 2130, a button 2131, a microphone 2132, a display portion 2133 provided with a touch panel, a speaker 2134, and a camera lens 2135 and functions as a mobile phone.

A memory device is incorporated as a part in the housing 2130. By employing the structure of the memory device and the driving method described in Embodiment 1 in the memory device, the smartphone can achieve low-power consumption and high-speed driving. By employing the driving method described in Embodiment 2, even when the need for increasing the storage capacity arises during software processing for example, the smartphone can achieve low-power consumption and high-speed driving.

The display portion 2133 changes the direction of display as appropriate depending on a use mode. Since the camera lens 2135 is provided on the same plane as the display portion 2133, videophone is possible. The speaker 2134 and the microphone 2132 can be used not only for voice calls, but also for video phone calls, recording, playing sound, and the like.

An external connection terminal 2136 can be connected to an AC adapter and various types of cables such as a USB cable, and charging and data communication with a personal computer are possible. Furthermore, a large amount of data can be stored and moved by inserting a storage medium into the external memory slot (not illustrated).

Further, in addition to the above functions, an infrared communication function, a television reception function, or the like may be provided.

Figure 9D:
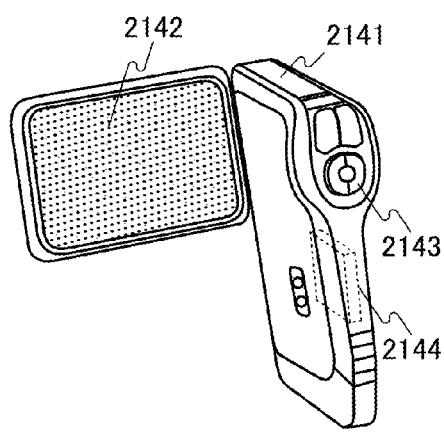

FIG. 9D illustrates a digital video camera which includes a main body 2141, a display portion 2142, an operation switch 2143, a battery 2144, and the like.

A memory device is incorporated as a part in the housing 2141. By employing the structure of the memory device and the driving method described in Embodiment 1 in the memory device, the digital video camera can achieve low-power consumption and high-speed driving. By employing the driving method described in Embodiment 2, even when the need for increasing the storage capacity arises during software processing for example, the digital video camera can achieve low-power consumption and high-speed driving.

Figure 9E:
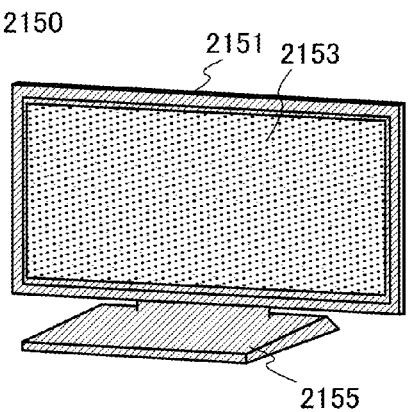

FIG. 9E illustrates an example of a television set. In a television set 2150, a display portion 2153 is incorporated in a housing 2151. The display portion 2153 can display images. In this example, the housing 2151 is supported by a stand 2155.

A memory device is incorporated as a part in the housing 2151. By employing the structure of the memory device and the driving method described in Embodiment 1 in the memory device, the television set 2150 can achieve low-power consumption and high-speed driving. By employing the driving method described in Embodiment 2, even when the need for increasing the storage capacity arises during software processing for example, the television set 2150 can achieve low-power consumption and high-speed driving.

The television set 2150 can be operated with an operation switch of the housing 2151 or a separate remote controller. Further, the remote controller may be provided with a display portion for displaying data output from the remote controller.

Note that the television set 2150 is provided with a receiver, a modem, and the like. With the receiver, a general television broadcast can be received. Furthermore, when the television set 2150 is connected to a communication network by wired or wireless connection via the modem, one-way (from a transmitter to a receiver) or two-way (between a transmitter and a receiver, between receivers, or the like) data communication can be performed.

This embodiment can be implemented in appropriate combination with any of the other embodiments.

This application is based on Japanese Patent Application serial no. 2012-114899 filed with Japan Patent Office on May 18, 2012, the entire contents of which are hereby incorporated by reference.

What is claimed is:

1. A memory device comprising:
a control circuit;
an input-output portion electrically connected to the control circuit;
an input signal line electrically connected to the input-output portion;
an output signal line electrically connected to the input-output portion;
a selection circuit electrically connected to the control circuit;
a selection signal line electrically connected to the selection circuit; and
a memory circuit electrically connected to the input signal line, the output signal line, and the selection signal line, the memory circuit comprising:
a memory cell;
a first switching element electrically connected between the input signal line and the memory cell;
a second switching element electrically connected between the output signal line and the memory cell;
a third switching element electrically connected to the input signal line;
a D/A converter electrically connected between the third switching element and the memory cell;
a fourth switching element electrically connected to the output signal line; and
an A/D converter electrically connected between the fourth switching element and the memory cell.

2. The memory device according to claim 1,
wherein the memory cell comprises:
a first transistor, one of a source and a drain of which is electrically connected to the first switching element and the D/A converter;
a capacitor, one of terminals of which is electrically connected to the other of the source and the drain of the first transistor;
a second transistor, a gate of which is electrically connected to the one of the terminals of the capacitor and the other of the source and the drain of the first transistor;
a signal supply portion electrically connected to one of the source and the drain of the second transistor and the other of the terminals of the capacitor; and
a third transistor, one of a source and a drain of which is electrically connected to the other of a source and a drain of the second transistor, and wherein the other of the source and the drain of the third transistor is electrically connected to the second switching element and the A/D converter.

3. The memory device according to claim 2, wherein an active layer of the first transistor includes an oxide semiconductor material.

4. An electronic device comprising the memory device according to claim 1.

5. A memory device comprising:
a memory circuit comprising a first signal transmission path for a single-level cell mode and a second signal transmission path for a multi-level cell mode;
a control circuit configured to select whether the memory circuit is used in the single-level cell mode or the multi-level cell mode;
an input-output portion configured to output a first signal based on the selection by the control circuit to the memory circuit and configured to be input a second signal from the memory circuit; and
a selection circuit configured to determine whether the first signal transmission path or the second signal transmission path is used based on the selection by the control circuit,
wherein the first signal transmission path includes a first input path including a first switching element, a first output path including a second switching element, and a memory cell electrically connected between the first input path and the first output path, and
wherein the second signal transmission path includes a second input path including a third switching element and a D/A converter, a second output path including a fourth switching element and an A/D converter, and the memory cell electrically connected between the second input path and the second output path.

6. The memory device according to claim 5, wherein the memory cell includes a storage function portion configured to store the first signal and an output function portion configured to output the second signal.

7. The memory device according to claim 6, wherein the storage function portion includes a first transistor, a second transistor, and a capacitor,
wherein the output function portion includes the second transistor and a signal supply portion,
wherein one of a source and a drain of the first transistor is electrically connected to the first input path and the second input path,
wherein the first signal input from the first input path is configured to be stored in a node which is electrically connected to the other of the source and the drain of the first transistor, a gate of the second transistor, and one of terminals of the capacitor,
wherein one of a source and a drain of the second transistor is electrically connected to the signal supply portion,
wherein the second signal based on the first signal is configured to be output from the other of the source and the drain of the second transistor, and
wherein an active layer of the first transistor includes an oxide semiconductor material.

8. The memory device according to claim 5, wherein the memory cell comprising:
a first transistor, one of a source and a drain of which is electrically connected to the first input path and the second input path;
a capacitor, one of terminals of which is electrically connected to the other of the source and the drain of the first transistor;
a second transistor, a gate of which is electrically connected to the one of the terminals of the capacitor and the other of the source and the drain of the first transistor;
a third transistor, one of a source and a drain of which is electrically connected to one of a source and a drain of the second transistor; and
a signal supply portion electrically connected to the other of the source and the drain of the second transistor,
wherein the other of the source and the drain of the third transistor is electrically connected to the first output path and the second output path.

9. The memory device according to claim 8, wherein an active layer of the first transistor includes an oxide semiconductor material.

10. The memory device according to claim 5, wherein the memory cell is configured to have properties of storing a written signal even when power is not supplied to the memory cell.

11. An electronic device comprising the memory device according to claim 5.

12. A method for driving a memory device including a memory circuit, the method comprising the steps of:
writing one of a single-bit data and a multi-bit data to a memory cell included in the memory circuit according to a selection by a control circuit electrically connected to the memory circuit; and
reading the one of the single-bit data and the multi-bit data from the memory cell,
wherein the memory circuit includes:
a first input path including a first switching element electrically connected to the memory cell;
a first output path including a second switching element electrically connected to the memory cell;
a second input path including a third switching element and a D/A converter electrically connected between the third switching element and the memory cell; and
a second output path including a fourth switching element and an A/D converter electrically connected between the fourth switching element and the memory cell,
wherein in the case of writing the single-bit data to the memory cell and reading the single-bit data from the memory cell, the single-bit data is written to the memory cell though the first input path and is read from the memory cell though the first output path, and
wherein in the case of writing the multi-bit data to the memory cell and reading the multi-bit data from the memory cell, the multi-bit data is written to the memory cell though the second input path and is read from the memory cell though the second output path.

13. The method according to claim 12,
wherein in the case of writing the single-bit data to the memory cell and reading the single-bit data from the memory cell, the third switching element and the fourth switching element are set in a non-conducting state and the first switching element and the second switching element are set in a conducting state, and
wherein in the case of writing the multi-bit data to the memory cell and reading the multi-bit data from the memory cell, the first switching element and the second switching element are set in a non-conducting state and the third switching element and the fourth switching element are set in a conducting state.

14. The method according to claim 12,
wherein the memory cell comprises:
a signal supply portion;

a first transistor, one of a source and a drain of which is electrically connected to the first input path and the second input path;

a second transistor, one of a source and a drain of which is electrically connected to the signal supply portion; and a capacitor, one of terminals of which is electrically connected to the other of the source and the drain of the first transistor and a gate of the second transistor, wherein a voltage of a signal supplied from the signal supply portion in the case of writing the single-bit data to the memory cell is lower than a voltage of a signal supplied from the signal supply portion in the case of writing the multi-bit data to the memory cell.

15. The method according to claim 14,
wherein an active layer of the first transistor includes an oxide semiconductor material.

16. A method for driving a memory device including a memory circuit, the method comprising the steps of:

writing a first multi-bit data to a memory cell included in the memory circuit, wherein the first multi-bit data includes a single-bit data and a second multi-bit data; and reading one of the single-bit data and the second multi-bit data from the memory cell, wherein the memory circuit further includes:
a first input path including a first switching element electrically connected to the memory cell;
a first output path including a second switching element electrically connected to the memory cell;
a second input path including a third switching element and a D/A converter electrically connected between the third switching element and the memory cell; and
a second output path including a fourth switching element and an A/D converter electrically connected between the fourth switching element and the memory cell, wherein the first multi-bit data is written to the memory cell though the second input path, wherein in the case of reading the single-bit data from the memory cell, the single-bit data is read from the memory cell though the first output path, and wherein in the case of reading the second multi-bit data from the memory cell, the second multi-bit data is read from the memory cell though the second output path.

17. The method according to claim 16,
wherein the first multi-bit data includes the most significant bit, the second most significant bit, and bits lower than the second most significant bit,
wherein the single-bit data is set in the most significant bit of the first multi-bit data,
wherein the second most significant bit is set to 0, and
wherein the second multi-bit data is set in the bits.

18. The method according to claim 16,
wherein in the case of reading the single-bit data from the memory cell, the third switching element and the fourth switching element are set in a non-conducting state and the first switching element and the second switching element are set in a conducting state, and
wherein in the case of writing the first multi-bit data to the memory cell and reading the second multi-bit data from the memory cell, the first switching element and the second switching element are set in a non-conducting state and the third switching element and the fourth switching element are set in a conducting state.

19. The method according to claim 16,
wherein the memory cell comprises:
a signal supply portion;
a first transistor, one of a source and a drain of which is electrically connected to the first input path and the second input path;
a second transistor, one of a source and a drain of which is electrically connected to the signal supply portion; and
a capacitor, one of terminals of which is electrically connected to the other of the source and the drain of the first transistor and a gate of the second transistor.

20. The method according to claim 19,
wherein an active layer of the first transistor includes an oxide semiconductor material.

* * * * *